US011592865B2

(12) United States Patent
Moon et al.

(10) Patent No.: US 11,592,865 B2
(45) Date of Patent: Feb. 28, 2023

(54) FOLDABLE ELECTRONIC DEVICE INCLUDING DISPLAY PROTECTION STRUCTURE

(71) Applicant: Samsung Electronics Co., Ltd., Suwon-si (KR)

(72) Inventors: Heecheul Moon, Suwon-si (KR); Sinyoung Park, Suwon-si (KR); Inyoul Baek, Suwon-si (KR); Seungwhee Choi, Suwon-si (KR); Jonghwan Choi, Suwon-si (KR); Jongchul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 157 days.

(21) Appl. No.: 17/062,483

(22) Filed: Oct. 2, 2020

(65) Prior Publication Data
US 2021/0116964 A1 Apr. 22, 2021

(30) Foreign Application Priority Data
Oct. 22, 2019 (KR) .................. 10-2019-0131715

(51) Int. Cl.
*G06F 1/16* (2006.01)
*H05K 5/02* (2006.01)
*H05K 5/03* (2006.01)

(52) U.S. Cl.
CPC .......... *G06F 1/1618* (2013.01); *G06F 1/1643* (2013.01); *G06F 1/1652* (2013.01);
(Continued)

(58) Field of Classification Search
None
See application file for complete search history.

(56) References Cited

U.S. PATENT DOCUMENTS 7,232,313 B1 * 6/2007 Shinoda ............. H01R 35/02
439/31
8,804,349 B2 8/2014 Lee et al.
(Continued)

FOREIGN PATENT DOCUMENTS

CN 208737797 U 4/2019
EP 3347791 A1 7/2018
(Continued)

OTHER PUBLICATIONS

International Search Report of the International Searching Authority in connection with International Application No. PCT/KR2020/012147 dated Dec. 4, 2020, 4 pages.
(Continued)

*Primary Examiner* — Anthony Q Edwards
*Assistant Examiner* — Rashen E Morrison

(57) ABSTRACT

An electronic device includes a hinge module; a first housing, a second housing, and a flexible display. The first housing is connected to the hinge module. The second housing is connected to the hinge module. The flexible display is disposed through at least a portion of the first and second housings. The flexible display includes a display panel includes a first surface facing in a first direction and a second surface facing in a direction opposite, when the electronic device is in an unfolded state. The flexible display also includes a window layer disposed at the first surface and a metal sheet layer. The display panel, the window layer, and the metal sheet layer are disposed so that a separation distance between the display panel, the window layer, and the metal sheet layer and inner side walls of the first and second housings and generates different interlayer slips.

20 Claims, 19 Drawing Sheets

(52) U.S. Cl.
CPC ......... *G06F 1/1681* (2013.01); *H05K 5/0226* (2013.01); *H05K 5/03* (2013.01); *G06F 2200/1612* (2013.01)

(56) References Cited

U.S. PATENT DOCUMENTS

| | | | |
|---|---|---|---|
| 10,227,808 B2* | 3/2019 | Siddiqui | E05D 3/12 |
| 10,485,115 B1* | 11/2019 | Cromer | G06F 1/1683 |
| 10,485,116 B2 | 11/2019 | Kim | |
| 10,509,439 B2 | 12/2019 | Choi et al. | |
| 10,798,836 B2* | 10/2020 | Manuel | E05D 7/00 |
| 2004/0255171 A1* | 12/2004 | Zimmer | G06F 1/3203 |
| | | | 713/300 |
| 2012/0120618 A1* | 5/2012 | Bohn | G06F 1/1618 |
| | | | 361/679.01 |
| 2015/0089974 A1* | 4/2015 | Seo | A44C 5/0076 |
| | | | 63/1.13 |
| 2015/0110991 A1 | 4/2015 | Miwa et al. | |
| 2015/0378397 A1 | 12/2015 | Park et al. | |
| 2016/0239133 A1* | 8/2016 | Ko | G06F 3/0448 |
| 2016/0302316 A1 | 10/2016 | Jeong et al. | |
| 2016/0357052 A1* | 12/2016 | Kim | G06F 1/1652 |
| 2017/0006738 A1 | 1/2017 | Lee et al. | |
| 2017/0013729 A1 | 1/2017 | Rothkopf et al. | |
| 2017/0061836 A1* | 3/2017 | Kim | G06F 1/1626 |
| 2017/0068275 A1 | 3/2017 | Lee et al. | |
| 2017/0192462 A1* | 7/2017 | Kim | B32B 27/28 |
| 2017/0308325 A1* | 10/2017 | Pearson | G06F 3/0604 |
| 2017/0336694 A1 | 11/2017 | Wu et al. | |
| 2018/0032462 A1* | 2/2018 | Olarig | G06F 13/4068 |
| 2018/0059736 A1 | 3/2018 | Kim et al. | |
| 2018/0324964 A1* | 11/2018 | Yoo | H05K 1/189 |
| 2019/0036068 A1* | 1/2019 | Kim | G06F 1/1652 |
| 2019/0196548 A1* | 6/2019 | Kim | G09F 9/301 |
| 2019/0200466 A1 | 6/2019 | Kim | |
| 2020/0257335 A1* | 8/2020 | Kim | G06F 1/1616 |
| 2021/0267073 A1 | 8/2021 | Fan | |

FOREIGN PATENT DOCUMENTS

| | | |
|---|---|---|
| EP | 3809400 A1 | 4/2021 |
| KR | 10-2016-0027878 A | 3/2016 |
| KR | 10-2017-0004068 A | 1/2017 |
| KR | 10-2018-0015003 A | 2/2018 |
| KR | 10-2019-0001864 A | 1/2019 |
| KR | 10-1986762 B1 | 5/2019 |
| KR | 10-2019-0078997 A | 7/2019 |
| WO | 2012157610 A1 | 11/2012 |

OTHER PUBLICATIONS

European Patent Office, "Supplementary European Search Report" dated Mar. 23, 2022, in connection with European Patent Application No. 20879892.6, 9 pages.

Japanese Patent Office, "Notice of Reasons for Refusal," dated Oct. 4, 2022, in connection with Japanese Patent Application No. 2021-570264, 11 pages.

* cited by examiner

FOLDABLE ELECTRONIC DEVICE INCLUDING DISPLAY PROTECTION STRUCTURE

CROSS-REFERENCE TO RELATED APPLICATION

This application is based on and claims priority under 35 U.S.C. 119 to Korean Patent Application No. 10-2019-0131715 filed on Oct. 22, 2019 in the Korean Intellectual Property Office, the disclosure of which is incorporated by reference herein in its entirety.

BACKGROUND

1. Field

Various embodiments of the disclosure relate to a foldable electronic device including a display protection structure.

2. Description of Related Art

Electronic devices are gradually becoming slim and are being improved to increase rigidity thereof, strengthen a design aspect, and differentiate functional elements thereof. These electronic devices are gradually being transformed into various shapes from a uniform rectangular shape. For example, the electronic device is convenient to carry and may have a transformable structure capable of using a large screen display when used. As a type of such an electronic device, a foldable electronic device in which at least two housings operate in a manner folded or unfolded with respect to each other has been continuously released, and various improvement measures according to a folding structure are provided.

The foldable electronic device may include a hinge module and a first housing and a second housing connected in opposite directions through the hinge module. The foldable electronic device may operate in an in-folding and/or out-folding manner by rotating the first housing in a range of 0° to 360° with respect to the second housing through the hinge module. The foldable electronic device may include a flexible display disposed to cross the first housing and the second housing in an open state of 180°.

Because the flexible display should be bent together with the housings, unlike a general bar type electronic device, the flexible display may receive the support of housings and be disposed to be capable of performing a self-movement according to folding and unfolding operations of a foldable electronic device. Further, a plurality of layers (e.g., window layer, display panel, or protective layer) of the flexible display may be attached to each other through an adhesive (e.g., pressure sensitive adhesive (PSA)) in which interlayer slip may occur in order to receive a difference in an amount of interlayer displacement according to a bending operation. Accordingly, the electronic device may provide a space for receiving interlayer slip according to the folding and unfolding operation and a self-movement structure of the flexible display.

However, by the self-movement structure of the flexible display, when an external impact such as a fall is applied to the foldable electronic device, an edge of the display panel collides with an inner side wall of the housing; thus, the display may be damaged. Moreover, when the corresponding space is increased for the purpose of buffering to improve the damage, this may counteract the slimming of the foldable electronic device.

SUMMARY

Various embodiments of the disclosure provide a foldable electronic device including a display protection structure.

According to various embodiments of the disclosure, an electronic device includes a hinge module; a first housing connected to the hinge module; a second housing connected to the hinge module so as to fold the first housing; a flexible display disposed through at least a portion of the first housing and the second housing, wherein the flexible display includes a display panel including a first surface facing in a first direction and a second surface facing in a direction opposite to that of the first surface, when the electronic device is in an unfolded state; a window layer disposed at the first surface; and a metal sheet layer disposed at the second surface of the display panel, wherein the display panel, the window layer, and the metal sheet layer are disposed so that a separation distance between the display panel, the window layer, and the metal sheet layer and inner side walls of the first housing and the second housing generate different interlayer slips in the unfolded state and a folded state of the electronic device, and wherein the metal sheet layer is disposed to at least partially overlap the display panel and is disposed closer to the inner side walls of the first housing and the second housing than the display panel, when viewed from above the flexible display.

According to various embodiments of the disclosure, an electronic device includes a hinge module; a first housing connected to the hinge module; a second housing connected to the hinge module so as to fold the first housing based on a first rotation axis; a flexible display disposed through at least a portion of the first housing and the second housing, wherein the flexible display includes a display panel including a first surface facing in a first direction and a second surface facing in a direction opposite to that of the first surface, when the electronic device is in an unfolded state; a window layer disposed at the first surface of the display panel; and a metal sheet layer disposed at the second surface of the display panel, wherein the flexible display is movably disposed on the first housing and the second housing in a direction perpendicular to the first rotation axis, when the electronic device is in a folded state and an unfolded state, and wherein the metal sheet layer is disposed to at least partially overlap the display panel and is disposed closer to inner side walls of the first housing and the second housing than the display panel, when viewed from above the flexible display.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
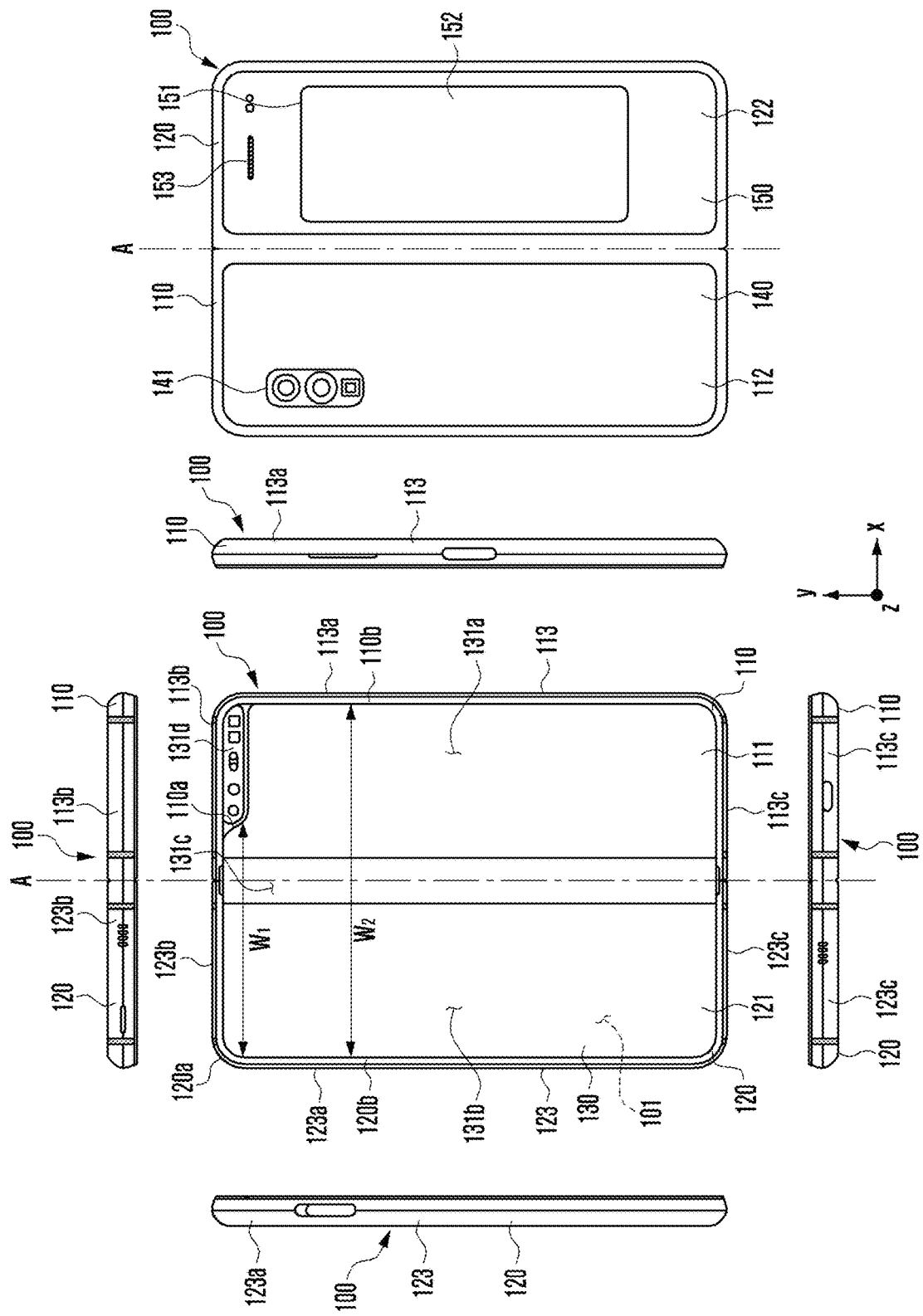
FIG. 1 illustrates a diagram of an unfolded state of an electronic device according to various embodiments of the disclosure.

FIG. 1 illustrates a diagram of an unfolded state of an electronic device according to an embodiment of the disclosure.

Referring to FIG. 1, an electronic device 100 may include a pair of housing structures 110 and 120 rotatably coupled via a hinge structure (e.g., hinge structure 164 in FIG. 3) to be folded relative to each other, a hinge cover 165 covering the foldable portion of the pair of housing structures 110 and 120, and a display 130 (e.g., flexible display or foldable display) disposed in the space formed by the pair of housing structures 110 and 120. In the description, the surface on which the display 130 is disposed may be referred to as the front surface of the electronic device 100, and the opposite side of the front surface may be referred to as the rear surface of the electronic device 100. The surface surrounding the space between the front surface and the rear surface may be referred to as the side surface of the electronic device 100.

In one embodiment, the pair of housing structures 110 and 120 may include a first housing structure 110 including a sensor region 131d, a second housing structure 120, a first rear cover 140, and a second rear cover 150. The pair of housing structures 110 and 120 of the electronic device 100 are not limited to the shape or combination illustrated in FIGS. 1 and 2, but may be implemented in various shapes or combinations. For example, in another embodiment, the first housing structure 110 and the first rear cover 140 may be formed as a single body, and the second housing structure 120 and the second rear cover 150 may be formed as a single body.

In one embodiment, the first housing structure 110 and the second housing structure 120 may be disposed at both sides with respect to the folding axis (A) and may be substantially symmetrical with respect to the folding axis (A). In one embodiment, the angle or distance between the first housing structure 110 and the second housing structure 120 may vary depending upon whether the electronic device 100 is in the flat state or closed state, the folded state, or the intermediate state. In one embodiment, the first housing structure 110 includes the sensor region 131d where various sensors are disposed, but may have a symmetrical shape with the second housing structure 120 in other regions. In another embodiment, the sensor region 131d may be disposed in a specific region of the second housing structure 120 or may be replaced.

In one embodiment, during the flat state of the electronic device 100, the first housing structure 110 may be connected to the hinge structure (e.g., hinge structure 164 in FIG. 3), and may include a first surface 111 facing the front surface of the electronic device 100, a second surface 112 facing away from the first surface 111, and a first side member 113 enclosing at least a portion of the space between the first surface 111 and the second surface 112. In one embodiment, the first side member 113 may include a first side surface 113a disposed in parallel with the folding axis (A), a second side surface 113b extending from one end of the first side surface 113a in a direction perpendicular to the folding axis, and a third side surface 113c extending from the other end of the first side surface 113a in a direction perpendicular to the folding axis.

In one embodiment, during the flat state of the electronic device 100, the second housing structure 120 may be connected to the hinge structure (e.g., hinge structure 164 in FIG. 3), and may include a third surface 121 facing the front surface of the electronic device 100, a fourth surface 122 facing away from the third surface 121, and a second side member 123 enclosing at least a portion of the space between the third surface 121 and the fourth surface 122. In one embodiment, the second side member 123 may include a fourth side surface 123a disposed in parallel with the folding axis (A), a fifth side surface 123b extending from one end of the fourth side surface 123a in a direction perpendicular to the folding axis, and a sixth side surface 123c extending from the other end of the fourth side surface 123a in a direction perpendicular to the folding axis. In one embodiment, the third surface 121 may face the first surface 111 in the folded state.

In one embodiment, the electronic device 100 may include a recess 101 formed to accommodate the display 130 through a structural combination of the shapes of the first housing structure 110 and the second housing structure 120. The recess 101 may have substantially the same size as the display 130. In one embodiment, the recess 101 may have two or more different widths in a direction perpendicular to the folding axis (A) due to the sensor region 131d. For example, the recess 101 may have a first width (W1) between a first portion 120a of the second housing structure 120 parallel to the folding axis (A) and a first portion 110a of the first housing structure 110 formed at the edge of the sensor region 131d, and have a second width (W2) between a second portion 120b of the second housing structure 120 and a second portion 110b of the first housing structure 110 that does not correspond to the sensor region 113d and is parallel to the folding axis (A). Here, the second width (W2) may be wider than the first width (W1). In other words, the recess 101 may be formed to have the first width (W1) ranging from the first portion 110a of the first housing structure 110 to the first portion 120a of the second housing structure 120 (asymmetric shape), and the second width (W2) ranging from the second portion 110b of the first housing structure 110 to the second portion 120b of the second housing structure 120 (symmetric shape). In one embodiment, the first portion 110a and the second portion 110b of the first housing structure 110 may be located at different distances from the folding axis (A). The width of the recess 101 is not limited to the example shown above. In various embodiments, the recess 101 may have two or more different widths owing to the shape of the sensor region 113d or the asymmetry of the first housing structure 110 or the second housing structure 120.

In one embodiment, at least a portion of the first housing structure 110 and the second housing structure 120 may be made of a metal or non-metal material having a rigidity value selected to support the display 130.

In one embodiment, the sensor region 131d may be formed to have a preset area near to one corner of the first housing structure 110. However, the arrangement, shape, or size of the sensor region 131d is not limited to the illustrated example. For example, in a certain embodiment, the sensor region 131d may be formed at another corner of the first housing structure 110 or in any region between the upper corner and the lower corner. In another embodiment, the sensor region 131d may be disposed at a portion of the second housing structure 120. In another embodiment, the sensor region 131d may be formed to extend between the first housing structure 110 and the second housing structure 120. In one embodiment, to perform various functions, the electronic device 100 may include components exposed to the front surface of the electronic device 100 through the sensor region 113d or through one or more openings provided in the sensor region 131d. The components may include, for example, at least one of a front camera, a receiver, a proximity sensor, an illuminance sensor, an iris recognition sensor, an ultrasonic sensor, or an indicator.

In one embodiment, the first rear cover 140 may be disposed on the second surface 112 of the first housing structure 110 and may have a substantially rectangular periphery. In one embodiment, at least a portion of the periphery may be wrapped by the first housing structure 110. Similarly, the second rear cover 150 may be disposed on the fourth surface 122 of the second housing structure 120, and at least a portion of the periphery thereof may be wrapped by the second housing structure 120.

In the illustrated embodiment, the first rear cover 140 and the second rear cover 150 may have a substantially symmetrical shape with respect to the folding axis (A). In another embodiment, the first rear cover 140 and the second rear cover 150 may have various different shapes. In another embodiment, the first rear cover 140 may be formed as a single body with the first housing structure 110, and the second rear cover 150 may be formed as a single body with the second housing structure 120.

In one embodiment, the first rear cover 140, the second rear cover 150, the first housing structure 110, and the second housing structure 120 may be combined with each other so as to provide a space where various components (e.g., printed circuit board, antenna module, sensor module, and battery) of the electronic device 100 can be arranged. In one embodiment, one or more components may be disposed on or visually exposed via the rear surface of the electronic device 100. For example, one or more components or sensors may be visually exposed through the first rear region 141 of the first rear cover 140. The sensors may include a proximity sensor, a rear camera, and/or a flash. In another embodiment, at least a portion of the sub display 152 may be visually exposed through the second rear region 151 of the second rear cover 150.

The display 130 may be disposed on the space formed by the pair of housing structures 110 and 120. For example, the display 130 may be seated in the recess (e.g., recess 101 in FIG. 1) formed by the pair of housing structures 110 and 120, and may be disposed to substantially occupy most of the front surface of the electronic device 100. Hence, the front surface of the electronic device 100 may include the display 130, a portion (e.g., edge region) of the first housing structure 110 close to the display 130, and a portion (e.g. edge region) of the second housing structure 120 close to the display 130. In one embodiment, the rear surface of the electronic device 100 may include the first rear cover 140, a portion (e.g., edge region) of the first housing structure 110 close to the first rear cover 140, the second rear cover 150, and a portion (e.g. edge region) of the second housing structure 120 close to the second rear cover 150.

In one embodiment, the display 130 may refer to a display in which at least a portion may be deformed into a flat or curved surface. In one embodiment, the display 130 may include a folding region 131c, a first region 131a disposed on one side (e.g., right side of the folding region 131c) with respect to the folding region 131c, and a second region 131b disposed on the other side (e.g., left side of the folding region 131c). For example, the first region 131a may be disposed on the first surface 111 of the first housing structure 110, and the second region 131b may be disposed on the third surface 121 of the second housing structure 120. This demarcation of the display 130 is only an example, and the display 130 may be subdivided into plural regions (e.g., four or more regions) according to the structure or functionality. For example, in the embodiment of FIG. 1, the area of the display 130 may be subdivided with respect to the folding region 131c or the folding axis (A) extending parallel to the y-axis. However, in another embodiment, the area of the display 130 may be subdivided with respect to a different folding region (e.g., folding region parallel to the x-axis) or a different folding axis (e.g., folding axis parallel to the x-axis). The aforementioned subdivision of the display is only a physical demarcation based on the pair of housing structures 110 and 120 and the hinge structure (e.g., hinge structure 164 in FIG. 3), and the display 130 may substantially present one full screen through the pair of housing structures 110 and 120 and the hinge structure (e.g., hinge structure 164 in FIG. 3). In one embodiment, the first region 131a and the second region 131b may have a symmetrical shape with respect to the folding region 131c. Although the first region 131a may include a notch region (e.g., notch area 133 in FIG. 3) cut according to the presence of the sensor region 131d, the first region 131a may have a symmetrical shape with the second region 131b in other portions. In other words, the first region 131a and the second region 131b may include portions with symmetrical shapes and portions with asymmetrical shapes.

Figure 2:
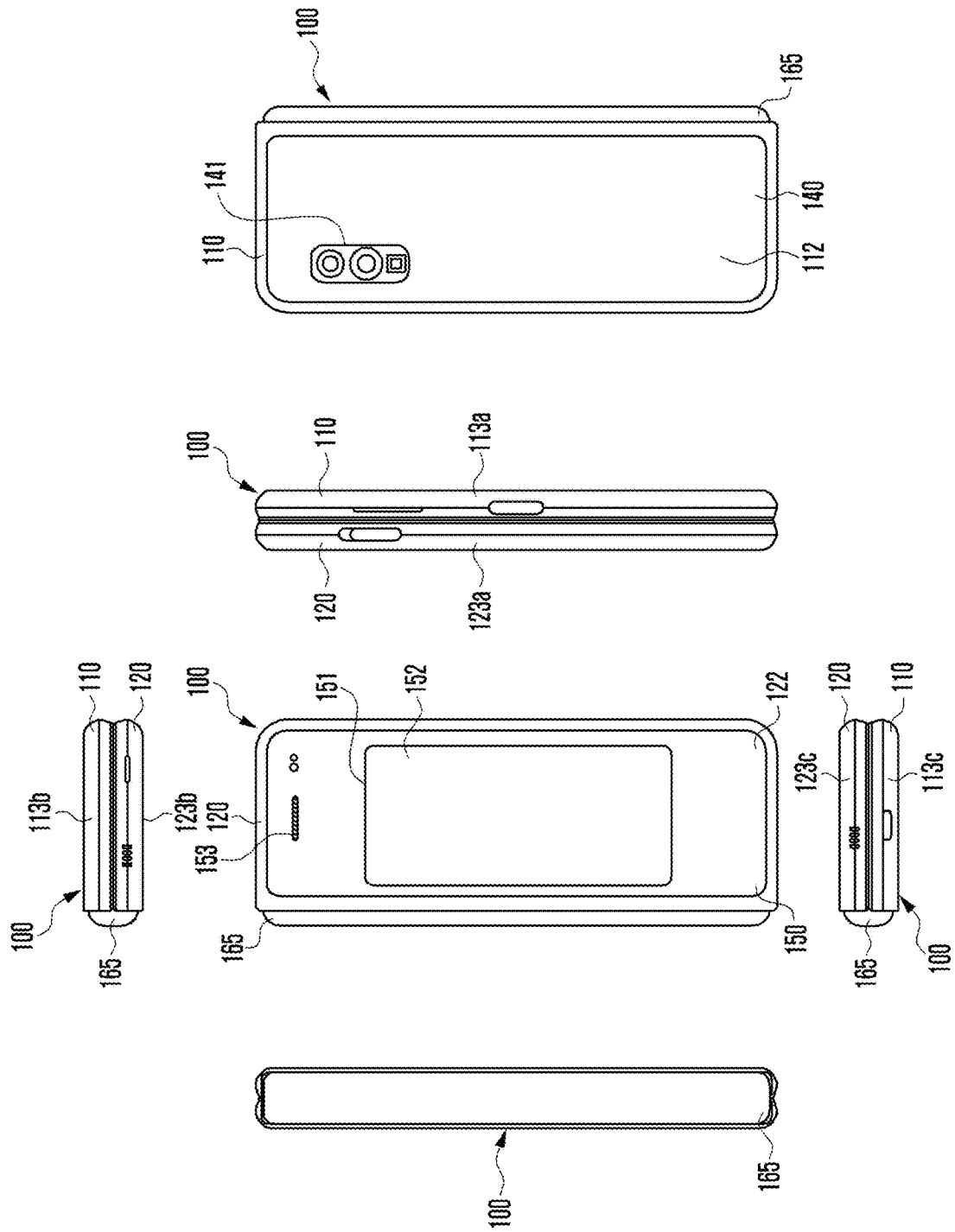
FIG. 2 illustrates a diagram of a folded state of the electronic device of FIG. 1 according to various embodiments of the disclosure.

FIG. 2 illustrates a diagram of a folded state of the electronic device of FIG. 1 according to an embodiment of the disclosure.

Figure 3:
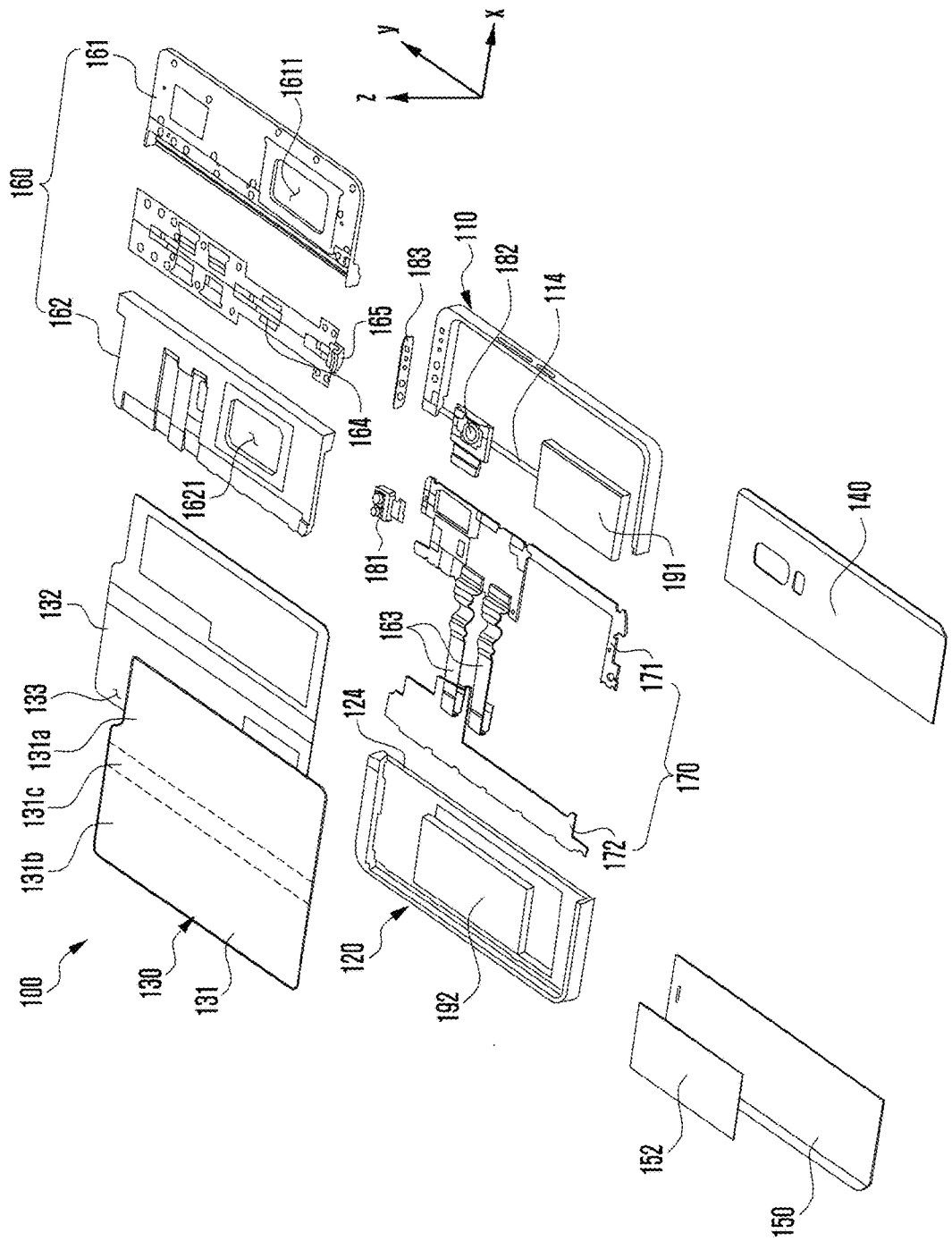
FIG. 3 illustrates an exploded perspective view of an electronic device according to various embodiments of the disclosure.

Referring to FIG. 2, the hinge cover 165 may be disposed between the first housing structure 110 and the second housing structure 120 so as to cover the internal components (e.g., hinge structure 164 in FIG. 3). In one embodiment, the hinge cover 165 may be covered by portions of the first housing structure 110 and the second housing structure 120 or be exposed to the outside according to the operating state (e.g., flat state or folded state) of the electronic device 100.

For example, when the electronic device 100 is in the flat state as illustrated in FIG. 1, the hinge cover 165 may be covered by the first housing structure 110 and the second housing structure 120 so as not to be exposed. When the electronic device 100 is in the folded state (e.g., completely folded state) as illustrated in FIG. 2, the hinge cover 165 may be exposed to the outside between the first housing structure 110 and the second housing structure 120. When the electronic device 100 is in the intermediate state where the first housing structure 110 and the second housing structure 120 make a certain angle, the hinge cover 165 may be partially exposed to the outside between the first housing structure 110 and the second housing structure 120. In this case, the exposed portion may be less than that for the fully folded state. In one embodiment, the hinge cover 165 may include a curved surface.

Next, a description is given of configurations of the first housing structure 110 and the second housing structure 120 and regions of the display 130 according to the operating state (e.g. flat state or folded state) of the electronic device 100.

In one embodiment, when the electronic device 100 is in the flat state (e.g., state of FIG. 1), the first housing structure 110 and the second housing structure 120 may make an angle of 180 degrees, and the first region 131a and the second region 131b of the display may be disposed to face in the same direction. In addition, the folding region 131c may be coplanar with the first region 131a and the second region 131b.

In one embodiment, when the electronic device 100 is in the folded state (e.g., state of FIG. 2), the first housing structure 110 and the second housing structure 120 may be disposed to face each other. The first region 131a and the second region 131b of the display 130 may face each other, making a narrow angle (e.g., between 0 degrees and 10 degrees). At least a portion of the folding region 131c may form a curved surface with a preset curvature.

In one embodiment, when the electronic device 100 is in the intermediate state, the first housing structure 110 and the second housing structure 120 may be disposed to make a certain angle. The first region 131a and the second region 131b of the display 130 may form an angle greater than that for the folded state and less than that for the flat state. At least a portion of the folding region 131c may form a curved surface with a preset curvature. This curvature may be less than that for the folded state.

FIG. 3 illustrates an exploded perspective view of an electronic device according to an embodiment of the disclosure.

Referring to FIG. 3, in one embodiment, the electronic device 100 may include a display 130, a support member assembly 160, at least one printed circuit board 170, a first housing structure 110, a second housing structure 120, a first rear cover 140, and a second rear cover 150. In the description, the display 130 may be referred to as a display unit, display module, or display assembly.

The display 130 may include a display panel 131 (e.g., flexible display panel), and at least one plate 132 or layer on which the display panel 131 is seated. In one embodiment, one or more plates 132 may include a conductive plate (e.g., Cu sheet or SUS sheet) disposed between the display panel 131 and the support member assembly 160. According to one embodiment, the conductive plate may be formed to have substantially the same area as that of the display, and an area facing a folding area of the display may be formed to be bendable. The plate 132 may include at least one subsidiary material layer (e.g., graphite member) disposed at a rear surface of the display panel 131. In one embodiment, the plate 132 may be formed in a shape corresponding to the display panel 131. For example, a partial area of the first plate 132 may be formed in a shape corresponding to the notch area 133 of the display panel 131.

The support member assembly 160 may include a first support member 161, a second support member 162, a hinge structure 164 disposed between the first support member 161 and the second support member 162, a hinge cover 165 to cover the hinge structure 164 when viewed from the outside, and a wiring member 163 (e.g., flexible printed circuit board (FPCB)) that crosses the first support member 161 and the second support member 162.

In one embodiment, the support member assembly 160 may be disposed between the plate 132 and at least one printed circuit board 170. For example, the first support member 161 may be disposed between the first region 131a of the display 130 and the first printed circuit board 171. The second support member 162 may be disposed between the second region 131b of the display 130 and the second printed circuit board 172.

In one embodiment, at least a portion of the wiring member 163 and the hinge structure 164 may be disposed within the support member assembly 160. The wiring member 163 may be disposed in a direction crossing the first support member 161 and the second support member 162 (e.g., x-axis direction). The wiring member 163 may be disposed in a direction (e.g., x-axis direction) perpendicular to the folding axis (e.g., y-axis or folding axis (A) in FIG. 2) of the folding region 131c.

The at least one printed circuit board 170 may include, as described above, the first printed circuit board 171 disposed on the side of the first support member 161, and the second printed circuit board 172 disposed on the side of the second support member 162. The first printed circuit board 171 and the second printed circuit board 172 may be disposed inside the space formed by the support member assembly 160, the first housing structure 110, the second housing structure 120, the first rear cover 140, and the second rear cover 150. Various components for implementing functions of the electronic device 100 may be mounted on the first printed circuit board 171 and the second printed circuit board 172.

In an embodiment, a first space of the first housing structure 110 may include a first printed circuit board 171 disposed in a space formed through the first support member 161, a first battery 191 disposed at a position facing a first swelling hole 1611 of the first support member 161, at least one sensor module 181, or at least one camera module 182. The first housing structure 110 may include a window glass 183 disposed to protect at least one sensor module 181 and at least one camera module 182 at a position corresponding to the notch area 133 of the display 130. In one embodiment, the second space of the second housing structure 120 may include a second printed circuit board 172 disposed in a second space formed through the second support member 162 and a second battery 192 disposed at a position facing the second swelling hole 1621 of the second support member 162. According to one embodiment, the first housing structure 110 and the first support member 161 may be integrally formed. According to one embodiment, the second housing structure 120 and the second support member 162 may also be integrally formed. According to an embodiment, a sub display 152 may be disposed in the second space of the second housing structure 120. According to an embodiment, the sub display 152 (e.g., the second display) may be disposed to be visible from the outside through at least a partial area of the second rear cover 150.

In one embodiment, the first housing structure 110 may include a first rotary support surface 114, and the second housing structure 120 may include a second rotary support surface 124 corresponding to the first rotary support surface 114. The first rotary support surface 114 and the second rotary support surface 124 may include a curved surface corresponding to the curved surface included in the hinge cover 165.

In one embodiment, when the electronic device 100 is in the flat state (e.g., state of FIG. 1), the first rotary support surface 114 and the second rotary support surface 124 may cover the hinge cover 165 so that the hinge cover 165 may be not or minimally exposed to the rear surface of the electronic device 100. When the electronic device 100 is in the folded state (e.g., state of FIG. 2), the first rotary support surface 114 and the second rotary support surface 124 may rotate along the curved surface included in the hinge cover 165 so that the hinge cover 165 may be maximally exposed to the rear surface of the electronic device 100.

Figure 4A:
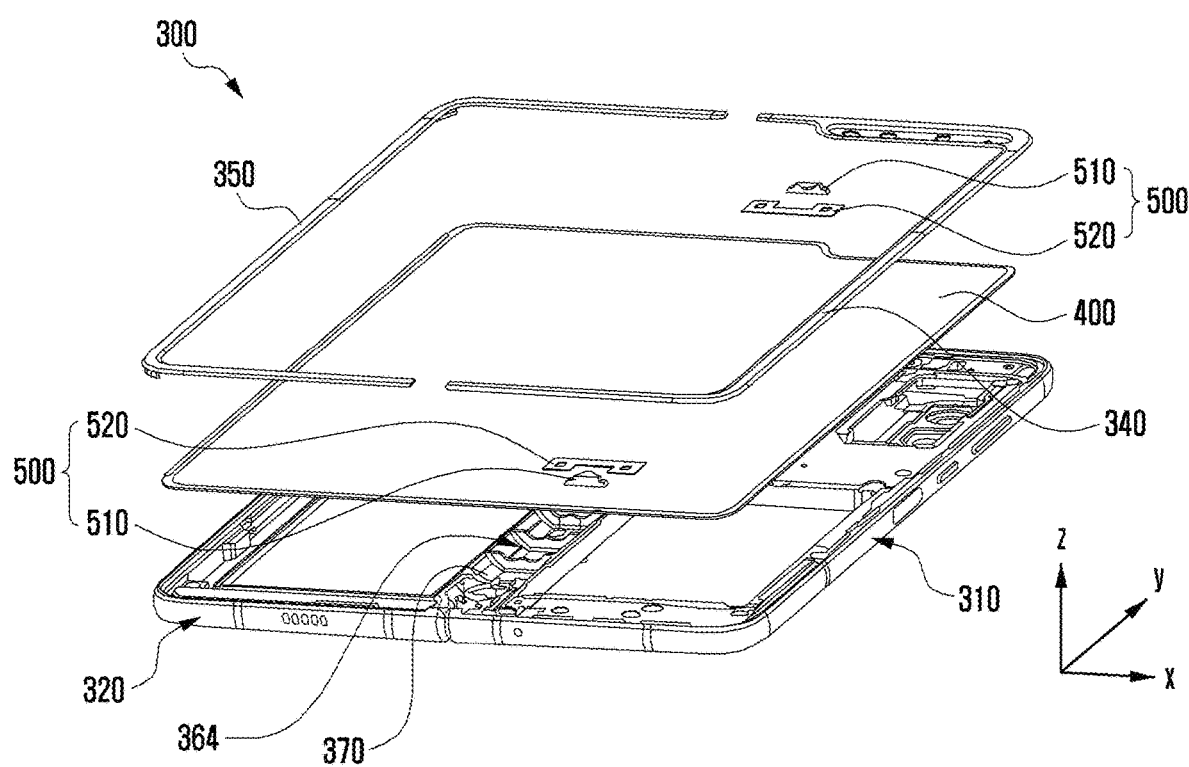
FIG. 4A illustrates an exploded perspective view of an electronic device including a flexible display according to various embodiments of the disclosure.
Figure 4B:
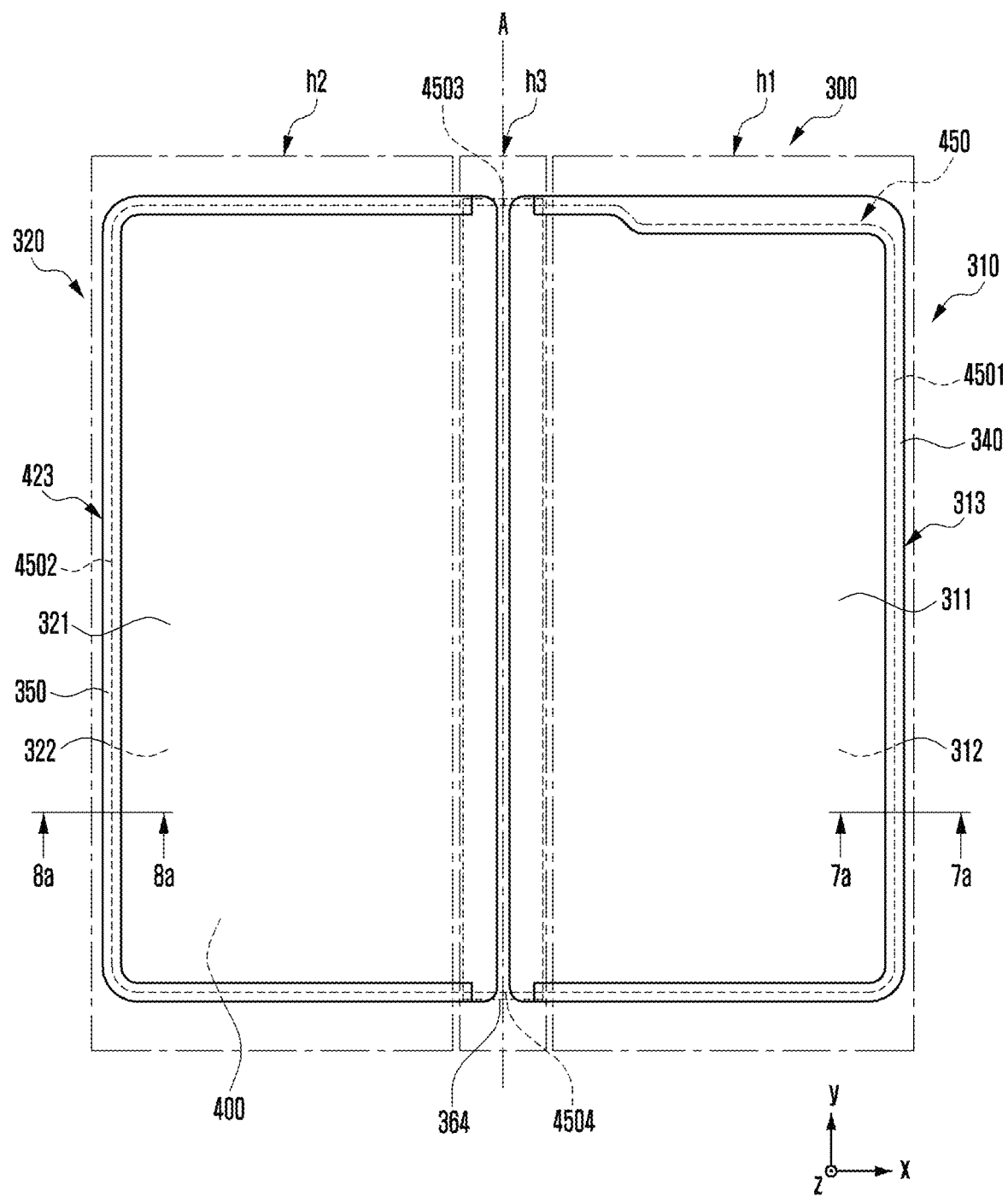
FIG. 4B illustrates a diagram of a configuration in each area of an electronic device according to various embodiments of the disclosure.

FIG. 4A illustrates an exploded perspective view of an electronic device 300 including a flexible display 400 according to various embodiments of the disclosure. FIG. 4B illustrates a diagram of a configuration in each area of the electronic device 300 according to various embodiments of the disclosure.

The electronic device 300 of FIGS. 4A and 4B may be at least partially similar to the electronic device 100 of FIG. 1 or may further include other components of the electronic device.

Referring to FIGS. 4A and 4B, the electronic device 300 (e.g., the electronic device 100 of FIG. 1) may include a first housing 310 (e.g., the first housing structure 110 of FIG. 1) including a first surface 311 (e.g., the first surface 111 of FIG. 1), a second surface 312 (e.g., the second surface 112 of FIG. 1) facing in a direction opposite to that of the first surface 311, and a first side member 313 (e.g., the first side member 113 of FIG. 1) enclosing a first space between the first surface 311 and the second surface 312. According to an embodiment, in an unfolded state, the electronic device 300 may include a second housing 320 (e.g., the second housing structure 120 of FIG. 1) including a third surface 321 (e.g., the third surface 121 of FIG. 1) facing in the same direction as that of the first surface 311, a fourth surface 322 (e.g., the fourth surface 122 of FIG. 1) facing in the same direction as that of the second surface 312, and a second side member 323 (e.g., the second side member 123 of FIG. 1) enclosing a second space between the third surface 321 and the fourth surface 322. According to an embodiment, the first housing 310 and the second housing 320 may be rotatably installed with respect to each other through the hinge module 364 (e.g., the hinge structure 164 of FIG. 3). For example, the electronic device 300 may maintain a folded or unfolded state by rotating the first housing 310 and the second housing 320 with respect to each other through the hinge module 364. According to an embodiment, in a folded state of the electronic device 300, the first surface 311 and the third surface 321 may face each other, and in an unfolded state of the electronic device 300, the first surface 311 and the third surface 321 may face the same direction. According to an embodiment, the electronic device 300 may include a flexible display 400 (e.g., the display 130 of FIG. 1) disposed to at least partially cross the first surface 311 and the third surface 321. According to one embodiment, the flexible display 400 may be disposed to receive support of at least a partial area of the first housing 310, the hinge module 364, and the second housing 320.

According to various embodiments, the electronic device 300 (e.g., the electronic device 100 of FIG. 1) may include a first area h1 facing the first housing 310, a second area h2 facing the second housing 320, and a folding area h3 facing the hinge module 364. According to an embodiment, the electronic device 300 may operate in a state in which the first housing 310 corresponding to the first area h1 is folded or unfolded with respect to the second housing 320 corresponding to the second area h2 through the hinge module 364 corresponding to the folding area h3.

According to various embodiments, the electronic device 300 may include at least one of protective frames 340 and 350 (e.g., decorative member or deco) disposed on the flexible display 400. According to an embodiment, at least one of the protection frames 340 and 350 may include a first protection frame 340 disposed on the flexible display in the first area h1 and a second protective frame 350 disposed on the flexible display in the second area h2. According to an embodiment, the protection frames 340 and 350 may be made of a polymer material or a metal material and be disposed at each of the housings 310 and 320 through at least one coupling method of bonding, taping, fusing, or structural coupling.

According to various embodiments, when viewed from above the flexible display 400, the electronic device may include a metal sheet layer 450 disposed under the display panel 430 and disposed to at least partially overlap with the display panel 430. According to an embodiment, when viewed from above the flexible display 400, the metal sheet layer 450 may be disposed closer than an edge of the display panel 430 from inner side walls (e.g., a first inner side wall 3102 of FIG. 7A and a second inner side wall 3202 of FIG. 8A) of a first side member (e.g., the first side member 113 of FIG. 1) and a second side member (e.g., the second side member 213 of FIG. 1) formed along an edge of the first housing 310 and the second housing 320. According to an embodiment, when viewed from above the flexible display 400, the metal sheet layer 450 may include edges 4501, 4502, 4503, and 4504 formed to protrude more outward than the display panel along an edge of the display panel 430. For example, the metal sheet layer 450 may include a first edge 4501 facing at least a portion of the first housing 310, a second edge 4502 facing at least a portion of the second housing 320, a third edge 4503 connecting one end of the first edge 4501 and one end of the second edge 4502, and a fourth edge 4504 connecting the other end of the first edge 4501 and the other end of the second edge 4502. According to an embodiment, the third edge 4503 and the fourth edge 4504 may be disposed to cross the second housing 320 from the first housing 310 through the hinge module 364.

According to various embodiments, the flexible display 400 may be disposed so that the edges of the display panel 430 and a portion of the first edge 4501, the third edge 4503, and the fourth edge 4504 of the metal sheet layer 450 are not exposed from between a first protection frame 340 and the first housing 310 to the outside. According to one embodiment, the flexible display 400 may be disposed so that the edges of the display panel 430 and a portion of the second edge 4502, the third edge 4503, and the fourth edge 4504 of the metal sheet layer 450 are not exposed from between a second protection frame 350 and the second housing 320 to the outside. According to an embodiment, the flexible display 400 may be movably disposed to be able to receive slip according to folding and unfolding operations of the electronic device 300 between the first housing 310 and the second housing 320 and the first protection frame 340 and the second protection frame 350. According to an embodiment, the flexible display 400 may slip in a direction (x axis direction) perpendicular to the rotation axis (axis A) of the electronic device.

According to various embodiments, a pair of protection frames 340 and 350 may be omitted in the folding area h3 corresponding to the hinge module 364 for folding and unfolding operations of the first housing 310 and the housing second 320 based on the hinge module 364. According to an embodiment, the electronic device 300 may include a protection structure 500 disposed to protect the edge of the flexible display 400 exposed to the outside in the folding area h3. According to an embodiment, the edge of the flexible display 400 exposed through the folding area h3 may be blocked to be at least partially invisible from the outside through the protective structure 500. According to one embodiment, the protective structure 500 may include a protective cap 510 disposed in a hinge housing 370 supporting the hinge module 364 and a blocking member 520 supported by the protective cap 510 and disposed to hide at least partially an edge of the flexible display 400 from the outside.

According to an embodiment of the disclosure, when viewed the flexible display 400 from above, because edges 4501, 4502, 4503, and 4504 of the metal sheet layer 450 disposed under the display panel 430 are disposed closer than the display panel from the inner side walls (e.g., the first inner side wall 3102 of FIG. 7A and the second inner side wall 3202 of FIG. 8A) of the housings 310 and 320, even if the flexible display 400 collides with any one of the inner side walls (e.g., the first inner side wall 3102 of FIG. 7A and the second inner side wall 3202 of FIG. 8A) of the housings 310 and 320 by an external impact, a buffering action occurs through a pre-impact of the metal sheet layer 450; thus, damage of the display panel 430 may be prevented. According to one embodiment, in the flexible display 400, inner side walls of the first housing 310 and the second housing 320 facing the third edge 4503 of the metal sheet layer 450 and inner side walls of the first housing 310 and the second housing 320 facing the fourth edge 4504 of the metal sheet layer 450 are disposed in substantially the same configuration; thus, in the event of an external impact, substantially the same buffering action can be performed.

Figure 5:
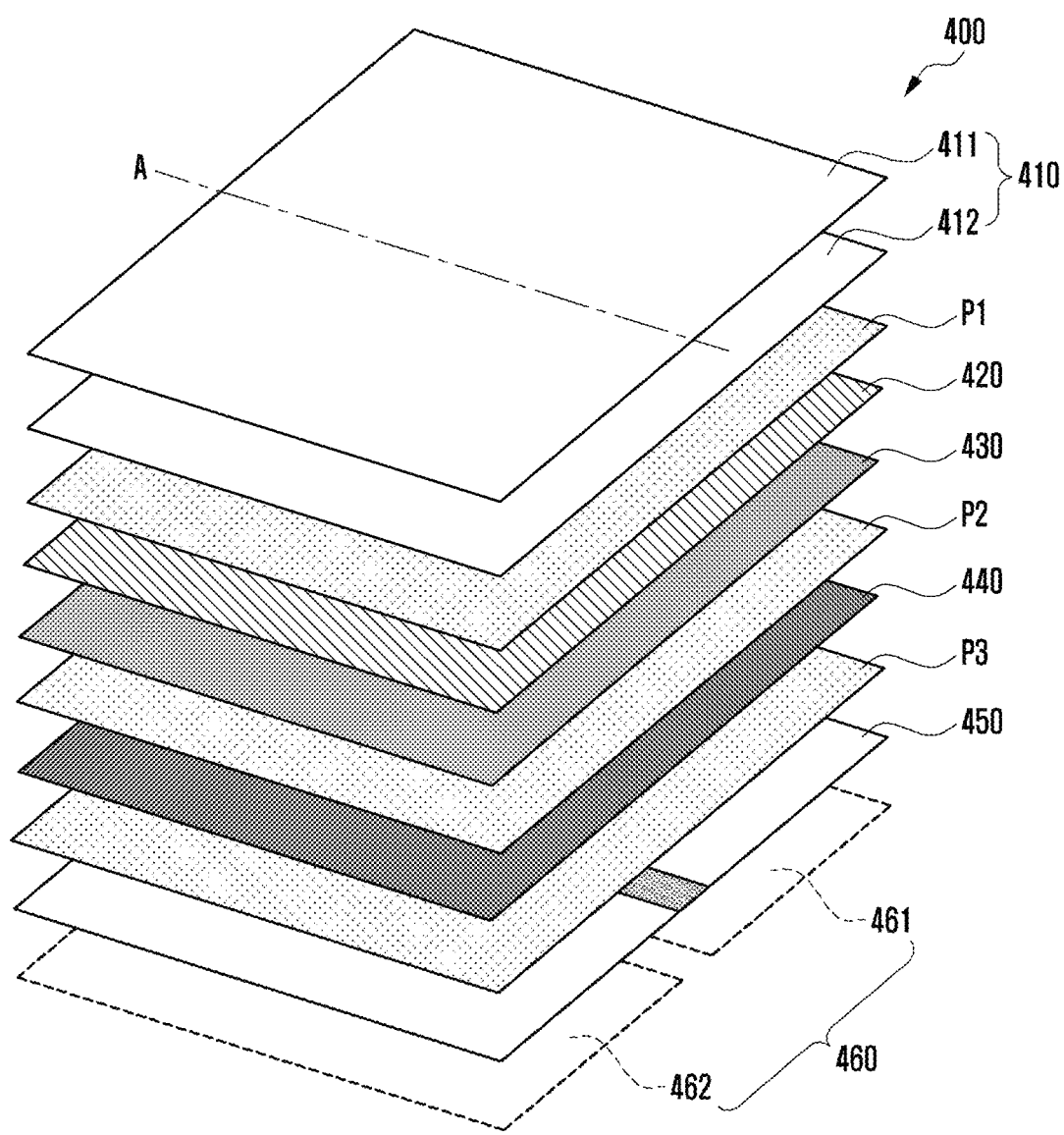
FIG. 5 illustrates a perspective view of a stacked structure of a flexible display according to various embodiments of the disclosure.

FIG. 5 illustrates a perspective view of a stacked structure of a flexible display 400 according to various embodiments of the disclosure.

The flexible display 400 of FIG. 5 may be at least partially similar to the display 130 of FIG. 1 or may further include other components of the flexible display.

Referring to FIG. 5, the flexible display 400 may include a window layer 410 and a polarization layer (e.g., polarizer (POL)) 420 (e.g., polarizing film), a display panel 430, a polymer member 440, and a metal sheet layer 450 sequentially disposed at a rear surface of the window layer 410. According to one embodiment, the window layer may include a polymer layer and a glass layer laminated with the polymer layer. According to one embodiment, the polymer layer may include polyethylene terephthalate (PET) or polyimide. According to one embodiment, the glass layer may include ultra thin glass (UTG).

According to various embodiments, the window layer 410, the polarization layer 420, the display panel 430, the polymer member 440, and the metal sheet layer 450 may be disposed to cross at least a portion of a first surface (e.g., the first surface 111 of FIG. 1) of the first housing (e.g., the first housing structure 110 of FIG. 1) and a third surface (e.g., the third surface 121 of FIG. 1) of the second housing (e.g., the second housing structure 120 of FIG. 1). According to one embodiment, the window layer 410, the polarizing layer 420, the display panel 430, the polymer member 440, and the metal sheet layer 450 may be attached to each other through adhesives P1, P2, and P3. For example, the adhesives P1, P2, and P3 may include at least one of an optical clear adhesive (OCA), a pressure sensitive adhesive (PSA), a heat reactive adhesive, a general adhesive, or a double-sided tape. According to one embodiment, the flexible display 400 may include another adhesive member (e.g., double-sided tape or waterproof member) disposed at least partially at one surface of the metal sheet layer 450. According to one embodiment, the flexible display 400 may be attached to a support member assembly (e.g., the support member assembly 160 of FIG. 3) of the electronic device (e.g., the electronic device 100 of FIG. 3) through another adhesive member.

According to various embodiments, the polymer member 440 may be applied with a dark color (e.g., black) to help to implement the background when the display is off. According to one embodiment, the polymer member 440 may act as a cushion for absorbing an impact from the outside of the electronic device to prevent damage of the flexible display 400.

According to various embodiments, the metal sheet layer 450 may help to reinforce stiffness of the electronic device, shield ambient noise, and be used for dissipating a heat emitted from peripheral heat emitting components. According to one embodiment, the metal sheet layer 450 may include at least one of steel use stainless (SUS) (e.g., stainless steel (STS)), Cu, Al, or CLAD (e.g., a stacked member in which SUS and Al are alternately disposed). In another embodiment, the metal sheet layer 450 may include other alloy materials. According to one embodiment, a portion facing the first housing (e.g., the first housing 310 of FIG. 4A) of the electronic device (e.g., the electronic device 300 of FIG. 4A) and a portion facing the second housing (e.g., the second housing 320 of FIG. 4A) are connected to a bendable portion formed in a portion facing the hinge module (e.g., the hinge module 364 of FIG. 4A); thus, the metal sheet layer 450 may be integrally formed. In another embodiment, in the metal sheet layer 450, a portion facing the first housing (e.g., the first housing 310 of FIG. 4A) and a portion facing the second housing (e.g., the second housing 320 of FIG. 4A), except for a portion facing the hinge module (the hinge module 364 of FIG. 4A) may be formed separately. According to various embodiments, the flexible display 400 may further include metal reinforcement plates 460 disposed beneath the metal sheet layer 450 for rigid reinforcement. According to one embodiment, the reinforcement plates 460 may include a first reinforcement plate 461 facing the first housing (e.g., the first housing 310 of FIG. 4A) and a second reinforcement plate 462 facing the second housing (e.g., the second housing 320 of FIG. 4A).

According to various embodiments, the flexible display 400 may include at least one functional member disposed between the polymer member 440 and the metal sheet layer 450. According to one embodiment, the functional member may include a graphite sheet for heat dissipation, an added display, a force touch flexible printed circuit board (FPCB), a fingerprint sensor FPCB, a communication antenna radiator, a heat dissipation sheet, a conductive/non-conductive tape, or an open cell sponge. According to one embodiment, when the functional member can be bent, the functional member may be disposed from the first housing (e.g., the first housing 310 of FIG. 4A) to at least a portion of the second housing (the second housing 320 of FIG. 4A) through the hinge module (e.g., the hinge module 364 of FIG. 4A). In another embodiment, the flexible display 400 may further include a detection member for detecting an input by an electromagnetic induction type writing member. According to one embodiment, the detection member may include a digitizer.

Figure 6A:
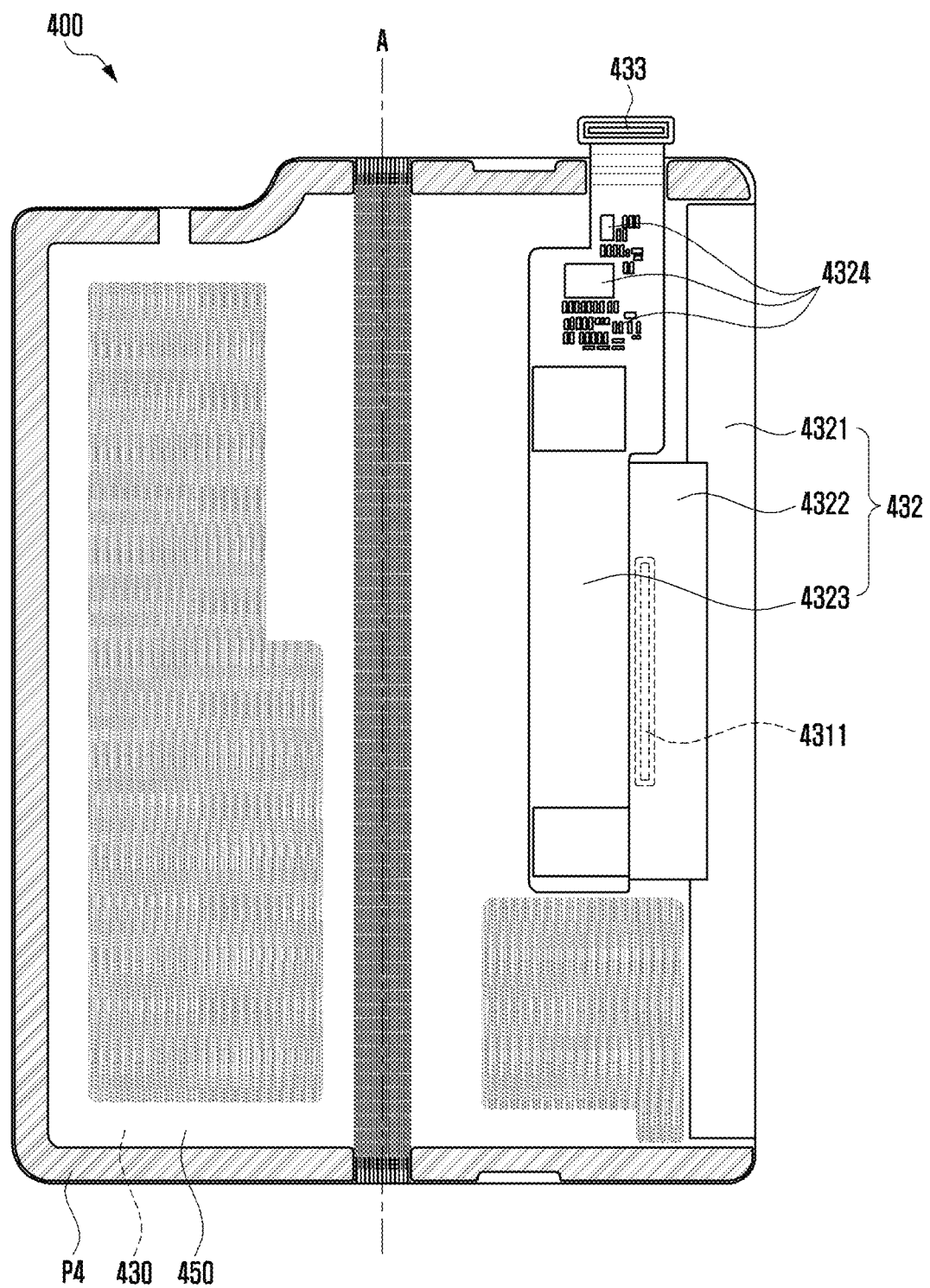
FIG. 6A illustrates a diagram of a configuration of a rear surface of a flexible display according to various embodiments of the disclosure.
Figure 6B:
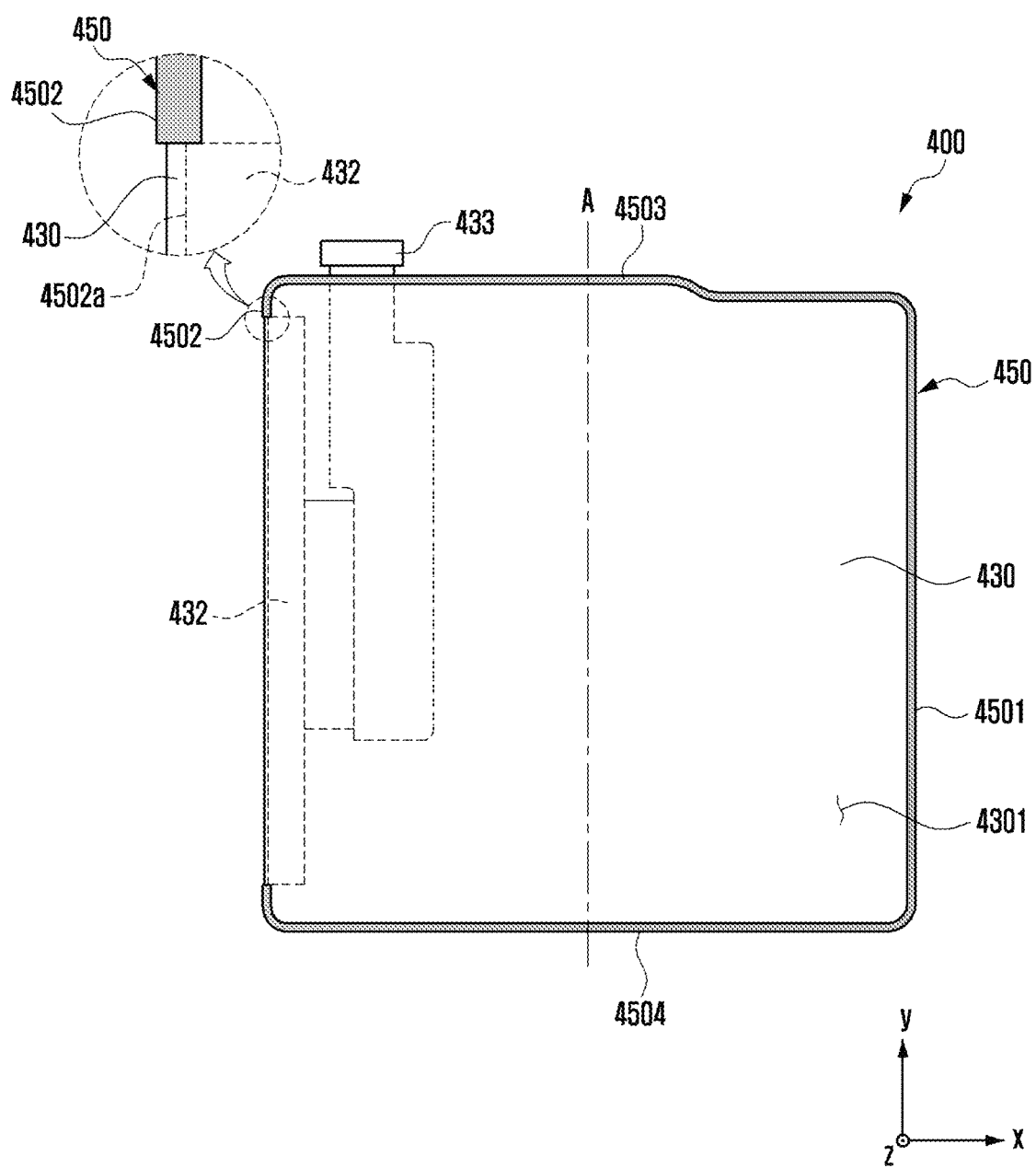
FIG. 6B illustrates a diagram of a disposition relationship between a display panel and a metal sheet layer according to various embodiments of the disclosure.

FIG. 6A illustrates a diagram of a configuration of a rear surface of the flexible display 400 according to various embodiments of the disclosure. FIG. 6B illustrates a diagram of a disposition relationship between the display panel 430 and the metal sheet layer 450 according to various embodiments of the disclosure.

Referring to FIGS. 6A and 6B, the flexible display 400 may include an FPCB 432 disposed in a folded manner from the display panel 430 to at least a partial area of the rear surface (e.g., the second surface 4302 of FIG. 7A) of the flexible display 400. According to one embodiment, the FPCB 432 may include an extension portion 4321 extended from the display panel 430, a connection pad 4322 electrically connected from the extension portion 4321 and including a control circuit 4311, and an element disposition portion 4323 electrically connected to the connection pad 4322. According to an embodiment, the control circuit 4311 may include a display driver IC (DDI) or a touch display driver IC (TDDI) mounted in the connection pad 4322 having an electrical wiring structure. According to an embodiment, the connection pad 4322 may include a separate FPCB or film including the control circuit 4311 disposed in a chip on film (COF) manner. In another embodiment, the control circuit 4311 may have a chip on panel (COP) structure mounted directly in the extension portion 4321 without the connection pad 4322. According to an embodiment, the flexible display 400 may include a plurality of elements 4324 disposed in the element disposition portion 4323. According to one embodiment, the flexible display 400 may include an electrical connector 433 extended from the element disposition portion 4323 and electrically connected to the second printed circuit board (e.g., the second printed circuit board 172 of FIG. 3) of the electronic device (e.g., the electronic device 100 of FIG. 3). According to an embodiment, the plurality of elements 4324 may include a touch IC, a flash memory for a display, an ESD prevention diode, a pressure sensor, or a passive element such as a decap. In another embodiment, when the FPCB 432 is disposed in an area facing the first housing (e.g., the first housing structure 110 of FIG. 1) of the flexible display 400, the electrical connector 433 may be electrically connected to the first printed circuit board (e.g., the first printed circuit board 171 of FIG. 3) of the electronic device (e.g., the electronic device 100 of FIG. 3).

According to various embodiments, the FPCB 432 extended from the display panel 430 may be folded through any one edge (e.g., the second edge 4502) of the metal sheet layer 450 and then be disposed in a manner contacting the metal sheet layer 450. According to one embodiment, the metal sheet layer 450 may include a receiving portion 4502a provided in a portion facing a folding portion of the FPCB 432 extended from the display panel 430 among the second edge 4502. According to one embodiment, the receiving portion 4502a may be formed to be recessed further than the second edge 4502. Therefore, even if the FPCB 432 is folded through the receiving portion 4502a, the second edge 4502 protrudes further than the FPCB 432; thus, the second edge 4502 of the metal sheet layer 450 may be induced to receive a pre-impact rather than the second housing (e.g., the second housing 320 of FIG. 4A) by an external impact. In another embodiment, as the FPCB 432 is disposed to protrude further than the second edge 4502 of the metal sheet layer 450, a buffering action through the FPCB 432 may be induced upon an external impact.

Figure 7A:
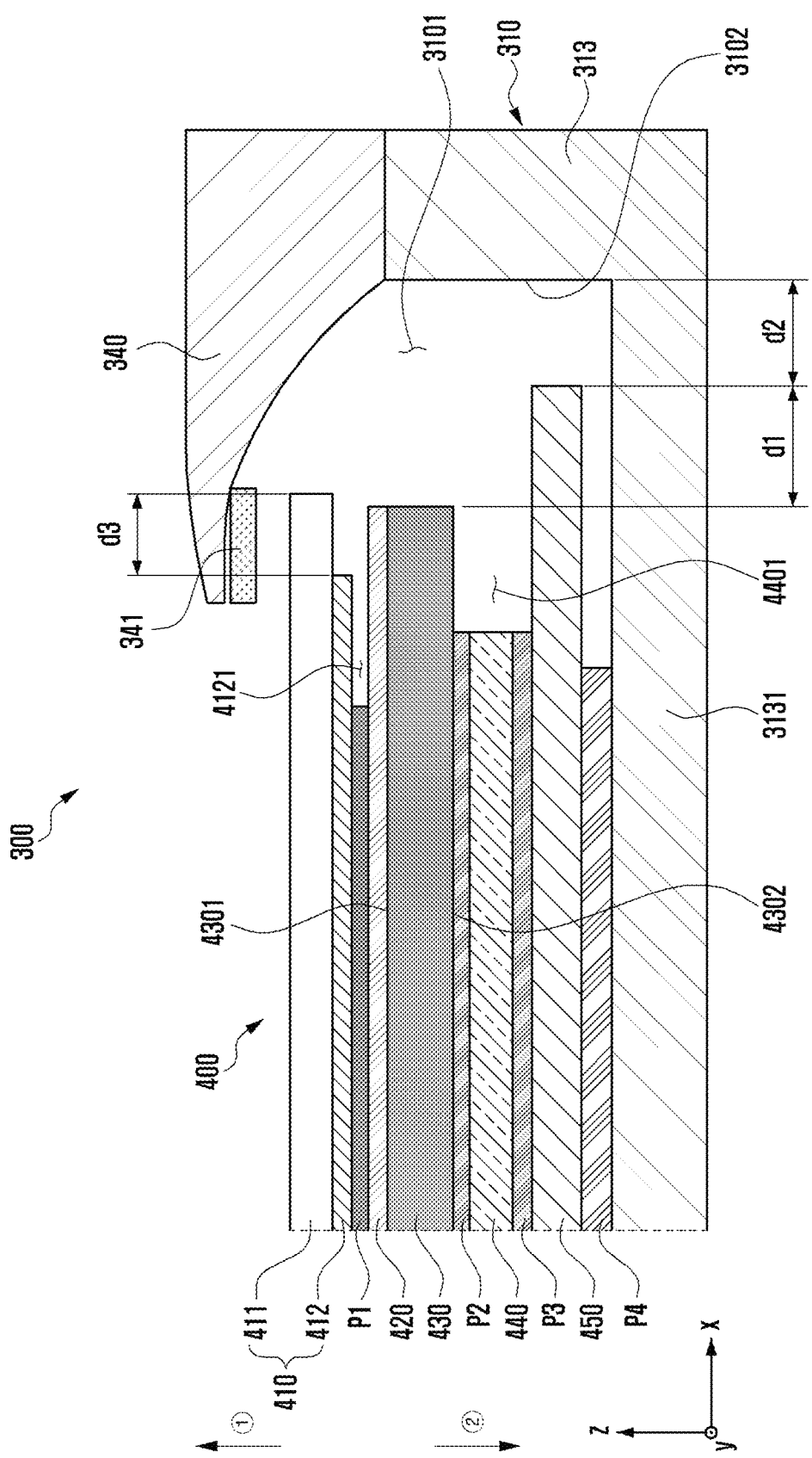
FIG. 7A illustrates a partial cross-sectional view of an electronic device viewed from line 7A-7A of FIG. 4B according to various embodiments of the disclosure.
Figure 7B:
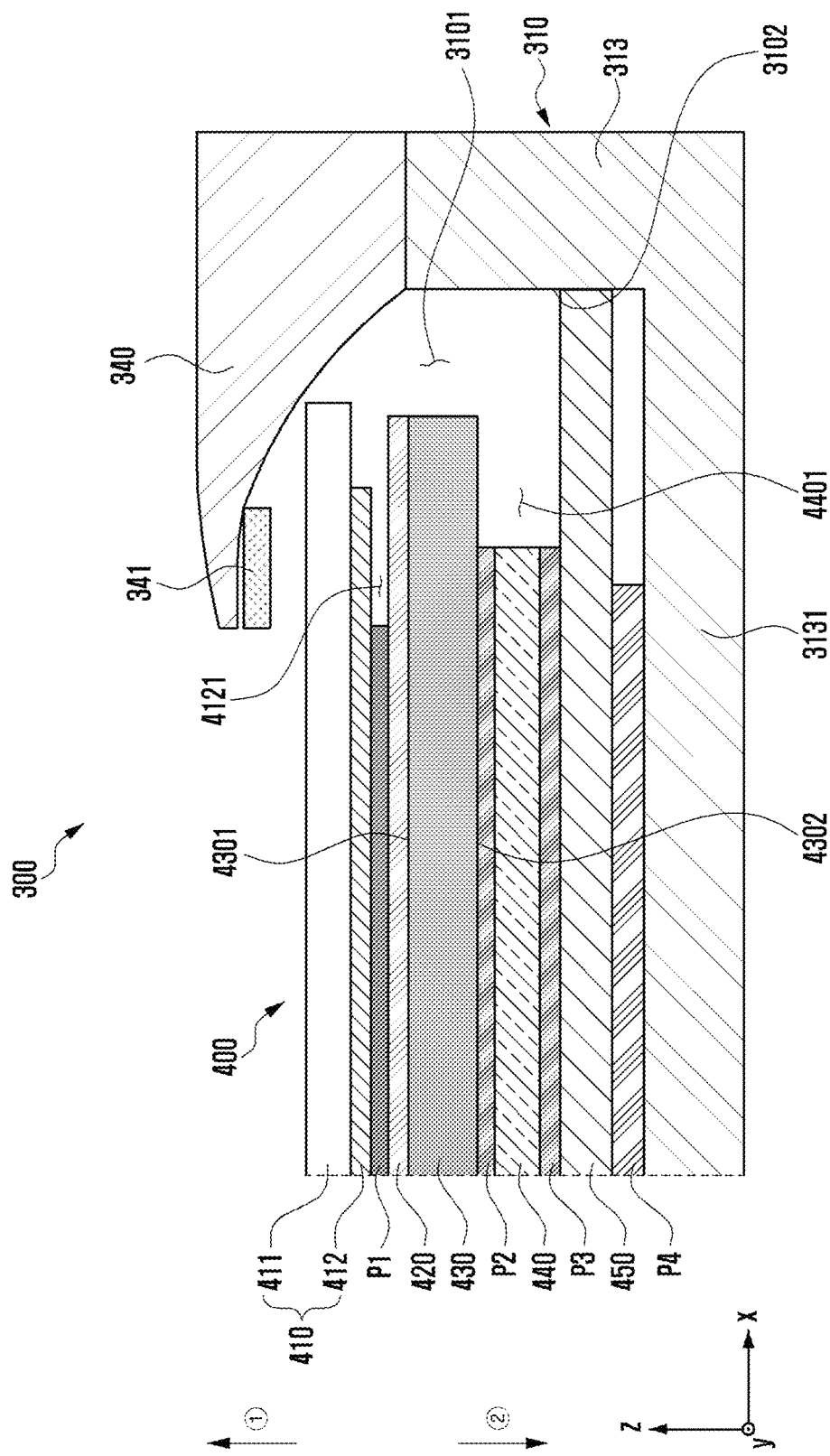
FIG. 7B illustrates a diagram depicting a movement of a flexible display when an external impact is applied to the electronic device of FIG. 7A according to various embodiments of the disclosure.

FIG. 7A illustrates a partial cross-sectional view of the electronic device 300 viewed from line 7A-7A of FIG. 4B according to various embodiments of the disclosure. FIG. 7B illustrates a diagram depicting a movement of the flexible display 400 when an external impact is applied in the electronic device 300 of FIG. 7A according to various embodiments of the disclosure.

Referring to FIG. 7A, the electronic device 300 may include a first housing 310 including a first side member 313, a first protection frame 340 disposed in at least a portion of the first side member 313, and a flexible display 400 disposed between the first side member 313 and the first protective frame 340. According to one embodiment, the flexible display 400 may be disposed to receive the support through a first support member 3131 structurally coupled or extended at least partially from the first side member 313 to an inner space of the first housing 310. According to one embodiment, at least a portion of the edge of the flexible display 400 may be disposed in the first space 3101 between the first inner side wall 3102 of the first side member 313 and the first protective frame 340. Accordingly, the edge of the flexible display 400 may be disposed to be invisible from the outside of the electronic device 300.

According to various embodiments, the flexible display 400 may include a display panel 430 including a first surface 4301 facing in a first direction (direction ①) and a second surface 4302 facing in a second direction (direction ②), which is a direction opposite to that of the first surface 4301. According to an embodiment, the flexible display 400 may include a window layer 410 disposed to face the first surface 4301 and a metal sheet layer 450 disposed to face the second surface 4302. According to one embodiment, the window layer 410 may include a polymer layer 411 (e.g., PET) and a glass layer 412 (e.g., UTG or polyimide) disposed beneath the polymer layer 411. According to an embodiment, the flexible display 400 may include a polarization layer 420 (e.g., POL) disposed between the first surface 4301 of the display panel 430 and the glass layer 412. According to an embodiment, the flexible display 400 may include a first reinforcement plate (e.g., metal plate) (not illustrated) disposed between the first support member 3131 and the metal sheet layer 450 and the polymer member 440 disposed between the second surface 4302 of the display panel 430 and the metal sheet layer 450. According to one embodiment, each layer may be attached to each other through adhesives P1, P2, and P3. According to one embodiment, the flexible display 400 may be attached to the first support member 3131 through an adhesive member P4. According to one embodiment, the electronic device 300 may further include a sealing member 341 disposed between the polymer layer 411 of the window layer 410 and the first protective frame 340 to prevent an external foreign material from entering.

According to various embodiments, when viewed from above the flexible display 400 (e.g., when viewed in a second direction (direction ②)), an edge of the metal sheet layer 450 may be disposed closer to the first inner side wall 3102 than an edge of the display panel 430. According to an embodiment, the metal sheet layer 450 may have a first protrusion amount d1 protruded further than the display panel 430 toward the first inner side wall 3102 and be disposed to protrude further than the display panel 430. According to an embodiment, the first protrusion amount d1 may be determined through a first separation distance d2 between the metal sheet layer 450 and the first inner side wall 3102. According to one embodiment, the first separation distance d2 may be determined based only on a distance that may receive a self-movement of the flexible display 400 and receive interlayer slip according to folding and unfolding operations of the electronic device 300 in a first space 3101. According to one embodiment, according to a disposition structure having the first protrusion amount d1 of the metal sheet layer 450 configured by the embodiment of the disclosure, because it is unnecessary to consider a collision of the display panel 430 by an external impact, the first separation distance d2 may be determined to be minimized and contribute to slimming of the electronic device 300.

According to various embodiments, when viewed from above the flexible display 400, the polymer layer 411 may have the same size as that of the glass layer 412 or may be formed larger to have a second protrusion amount d3 in an inner side wall direction (x-axis direction). According to an embodiment, the polymer layer 411 may be formed to be larger than the glass layer 412 to protect the glass layer 412 and help to prevent glass pieces from scattering when the glass layer is damaged. According to an embodiment, between the glass layer 412 and the polarizing layer 420, the adhesive P1 may be disposed to be smaller than the glass layer 412, when viewed from above the flexible display 400. For example, a non-adhesive area 4121 disposed between the glass layer 412 and the polarizing layer 420 may help to reduce a black matrix (BM) area of the flexible display 400. According to one embodiment, the polymer member 440 between the display panel 430 and the metal sheet layer 450 also provides an area 4401 disposed to be smaller than the display panel 430, thereby helping to reduce the first protrusion amount d1 of the metal sheet layer 450.

Referring to FIG. 7B, when the electronic device 300 is in an unfolded state, if an external impact such as a fall occurs, the flexible display 400 movably disposed between the first protection frame 340 and the first housing 310 may be moved toward the first inner side wall 3102 (in the x-axis direction). In this case, as the edge of the metal sheet layer 450 disposed to protrude further than the display panel 430 first contacts the first inner side wall 3102 of the first side member 313 of the first housing 310, the edge may receive a pre-impact, and the display panel 430 may receive a relatively small impact to be protected from damage.

Figure 8A:
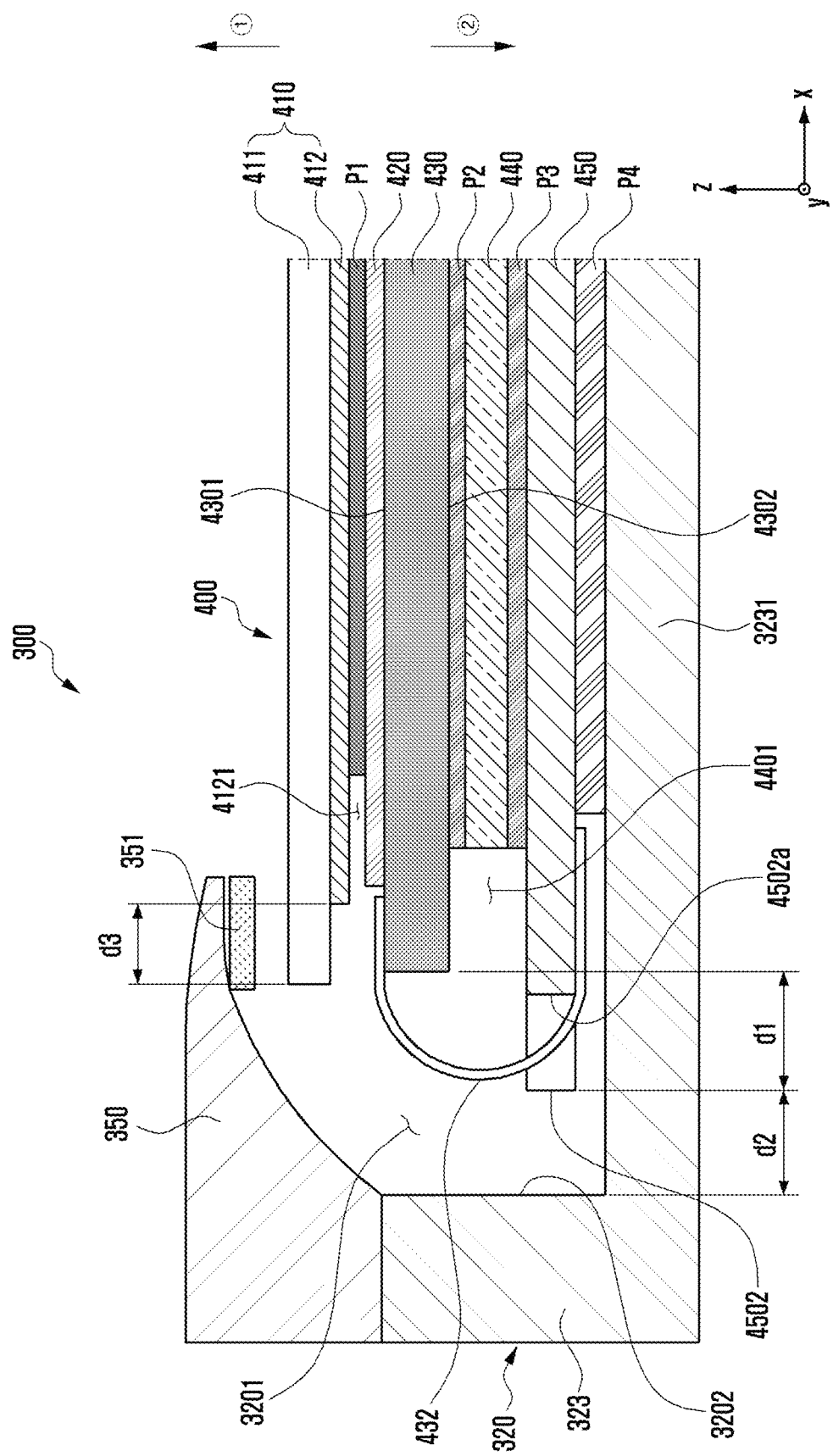
FIG. 8A illustrates a partial cross-sectional view of an electronic device viewed from line 8A-8A of FIG. 4B according to various embodiments of the disclosure.
Figure 8B:
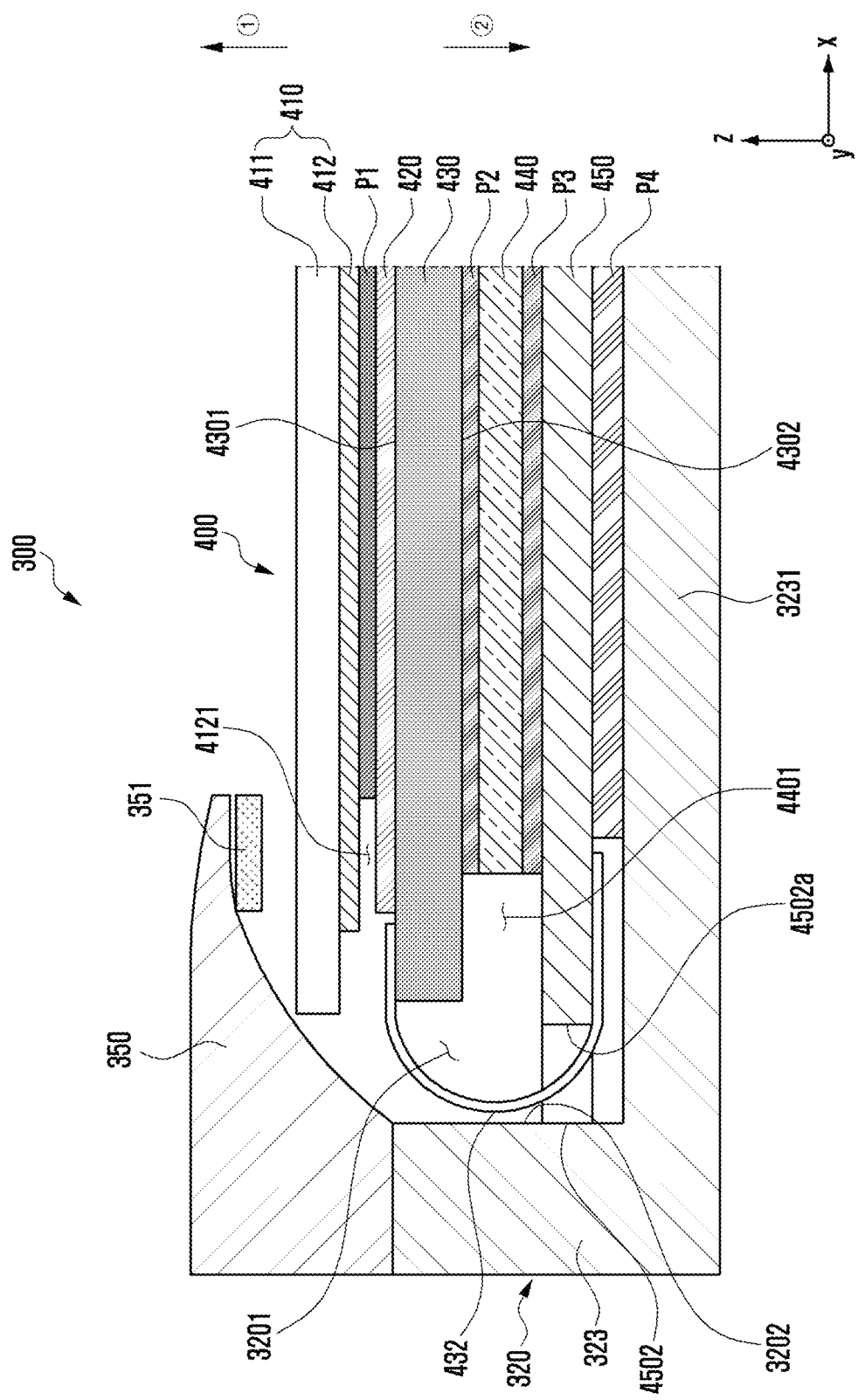
FIG. 8B illustrates a diagram illustrating a depicting of a flexible display when an external impact is applied to the electronic device of FIG. 8A according to various embodiments of the disclosure.

FIG. 8A illustrates a partial cross-sectional view of the electronic device 300 viewed from line 8A-8A of FIG. 4B according to various embodiments of the disclosure. FIG. 8B illustrates a diagram depicting a movement of the flexible display 400 when an external impact occurs in the electronic device 300 of FIG. 8A according to various embodiments of the disclosure.

In describing FIGS. 8A and 8B, substantially the same components as those of FIGS. 7A and 7B are denoted by the same reference numerals, and a disposition structure of the flexible display 400 is substantially the same; thus, a detailed description thereof may be omitted.

Referring to FIG. 8A, the electronic device 300 may include a second housing 320 including a second side member 323, a second protection frame 350 disposed in at least a portion of the second side member 323, and a flexible display 400 disposed between the second side member 323 and the second protection frame 350. According to one embodiment, the flexible display 400 may be disposed to receive the support through a second support member 3231 structurally coupled or extended at least partially from the second side member 323 to an inner space of the second housing 320. According to one embodiment, at least a portion of the edge of the flexible display 400 may be disposed in a second space 3201 between the second protective frame 350 and the second inner side wall 3202 of the second side member 323. Accordingly, the edge of the flexible display 400 may be disposed to be invisible from the outside of the electronic device 300. According to an embodiment, the electronic device 300 may further include a sealing member 351 disposed between the polymer layer 411 of the window layer 410 and the second protective frame 350 to prevent an external foreign material from entering.

According to various embodiments, when viewed from above the flexible display 400 (e.g., when viewed in the second direction (direction ②)), the edge of the metal sheet layer 450 may be disposed closer to the second inner side wall 3202 than the edge of the display panel 430. According to an embodiment, the metal sheet layer 450 may have a first protrusion amount d1 protruded further than the display panel 430 toward the second inner side wall 3202 and be disposed to protrude further than the display panel 430. According to an embodiment, the first protrusion amount d1 may be determined through a first separation distance d2 between the metal sheet layer 450 and the second inner side wall 3202. According to an embodiment, the first separation distance d2 may be determined based only on a distance that may receive a self-movement of the flexible display 400 and receive interlayer slip according to the folding and unfolding operation of the electronic device 300 in the second space 3201. According to one embodiment, according to a disposition structure having the first protrusion amount d1 of the metal sheet layer 450 configured by the embodiment of the disclosure, because it is unnecessary to consider a collision of the display panel 430 by an external impact, the first separation distance d2 may be determined to be minimized and contribute to slimming of the electronic device 300.

According to various embodiments, the flexible display 400 may include an FPCB 432 extended from the display panel 430, folded toward the second surface 4302, and attached to the metal sheet layer 450. According to an embodiment, a folding portion of the FPCB 432 may be protruded in a direction (−x axis direction) toward the second inner side surface 3202 from the display panel 430. According to one embodiment, because the folding portion of the FPCB 432 may be received in the receiving portion 4302a formed to be recessed further than the edge in the metal sheet layer 450, the folding portion may have a protrusion amount less than the first protrusion amount d1 of the metal sheet layer 450. Accordingly, when the flexible display 400 is moved by an external impact, the edge of the metal sheet layer 450 may receive a pre-impact.

Referring to FIG. 8B, when the electronic device 300 is in an unfolded state, if an external impact such as a fall occurs, the flexible display 400 movably disposed between the second protection frame 350 and the second housing 320 may be moved toward the second inner side wall 3202 (in −x axis direction). In this case, an edge of the metal sheet layer 450 disposed to protrude further than the FPCB 432 first contacts the second inner side wall 3202 of the second side member 323 of the second housing 320, thereby receiving a pre-impact, and the display panel 430 may receive a relatively small impact to protect from damage.

FIG. illustrates is a partial cross-sectional view of an electronic device 300 according to various embodiments of the disclosure. FIG. 9B illustrates a diagram depicting a movement of the flexible display 400 upon an external impact in the electronic device 300 of FIG. 9A according to various embodiments of the disclosure.

Figure 9A:
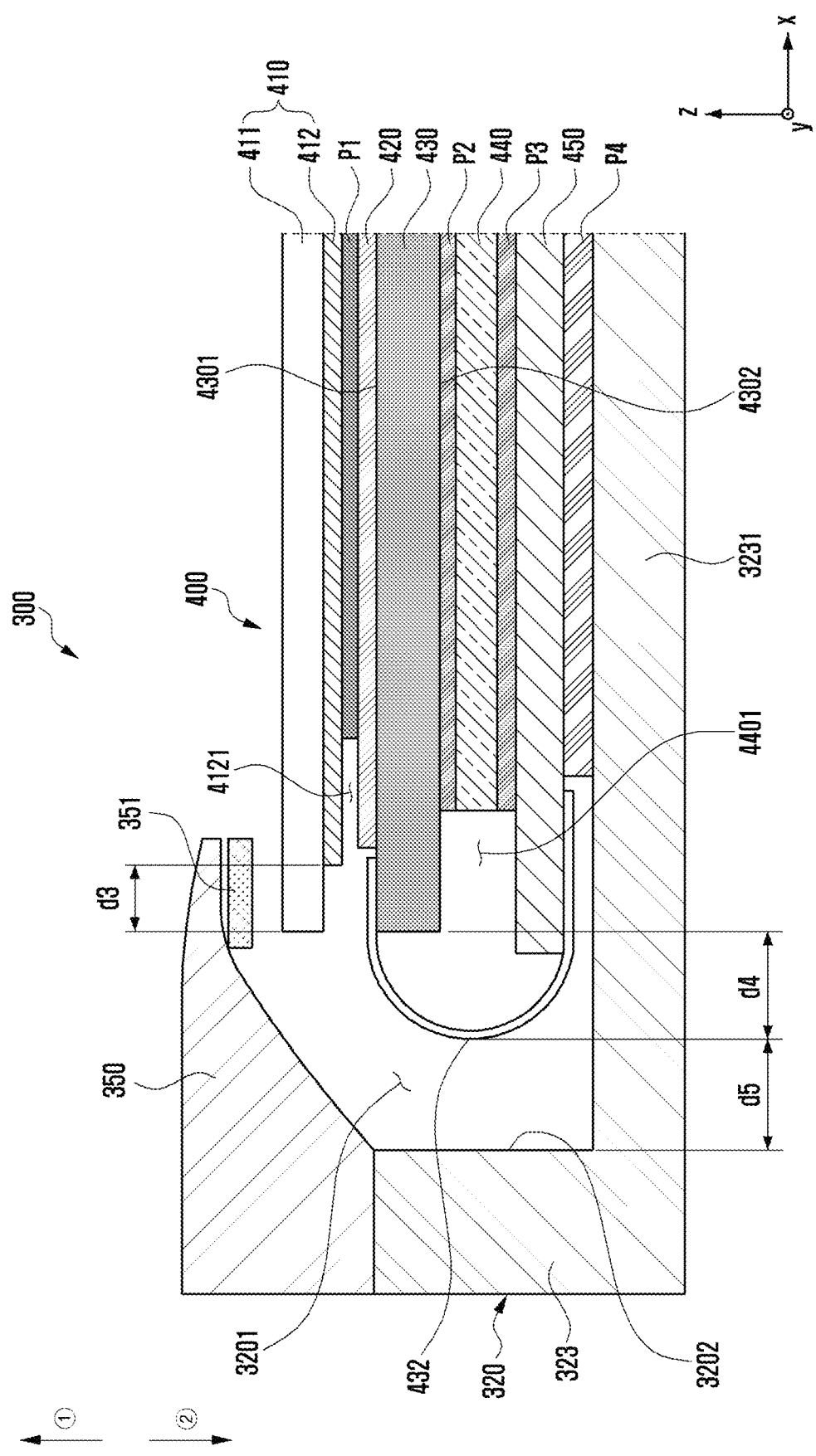
FIG. 9A illustrates a partial cross-sectional views of an electronic device according to various embodiments of the disclosure.
Figure 9B:
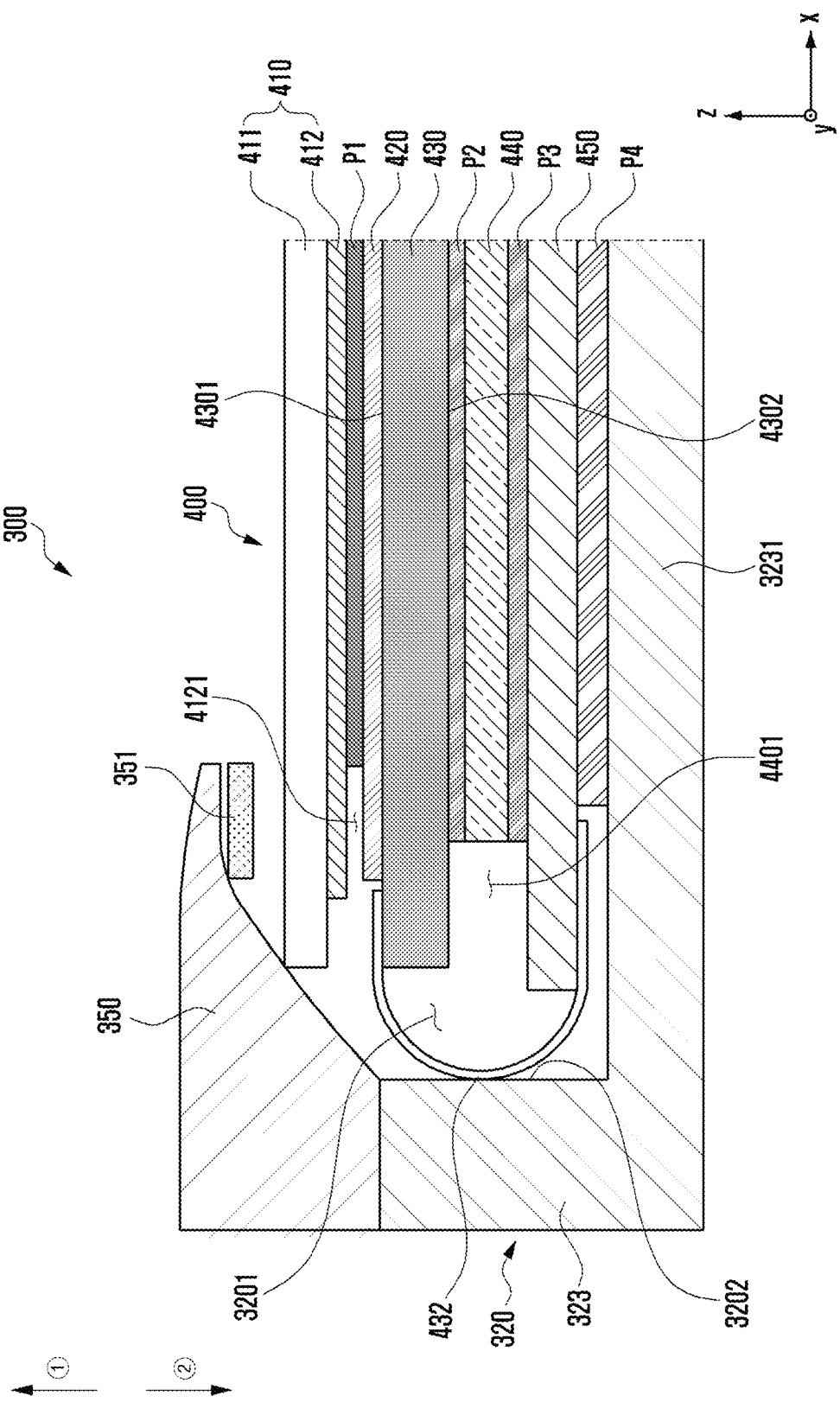
FIG. 9B illustrates a diagram depicting a movement of a flexible display upon an external impact in the electronic device of FIG. 9A according to various embodiments of the disclosure.

In describing FIGS. 9A and 9B, substantially the same components as a configuration of the electronic device 300 of FIGS. 8A and 8B are denoted by the same reference numerals, and a disposition structure of the flexible display 400 is substantially the same; thus, a detailed description thereof may be omitted.

Referring to FIG. 9A, the flexible display 400 may include an FPCB 432 extended from the display panel 430, folded toward the second surface 4302, and attached to the metal sheet layer 450. According to one embodiment, a folded portion of the FPCB 432 may be protruded to have a third protrusion amount d4 protruded further than that of the metal sheet layer 450 in a direction (−x axis direction) toward the second inner side surface 3202 from the display panel 430. Accordingly, when the flexible display 400 is moved by an external impact, the folding portion of the FPCB 432 may receive a pre-impact. According to one embodiment, the third protrusion amount d4 may be determined through a second separation distance d5 between the metal sheet layer 450 and the first inner side wall 3202. According to one embodiment, the second separation distance d5 may be determined based only on a distance that may receive a self-movement of the flexible display 400 and receive interlayer slip according to the folding and unfolding operation of the electronic device 300 in the second space 3201. According to an embodiment, by an embodiment of the disclosure, because it is unnecessary to consider collision of the display panel 430 by external impact according to an disposition structure having a third protrusion amount d4 through a folding portion of the FPCB 432, the second separation distance d5 may be determined to be minimized and contribute to slimming of the electronic device 300. According to an embodiment, the first separation distance d2 and the second separation distance d5 may be substantially the same. According to one embodiment, the first protrusion amount d1 and the third protrusion amount d4 may be substantially the same.

Referring to FIG. 9B, when the electronic device 300 is in an unfolded state, if an external impact such as a fall occurs, the flexible display 400 movably disposed between the second protection frame 350 and the second housing 320 may be moved toward the second inner side wall 3202 (in −x axis direction). In this case, the folding portion of the FPCB 432 disposed to protrude further than the metal sheet layer 450 first contacts the second inner side wall 3202 of the second side member 323 of the second housing 320, thereby receiving a pre-impact, and the display panel 430 may receive a relatively small impact to be protected from damage.

Figure 10A:
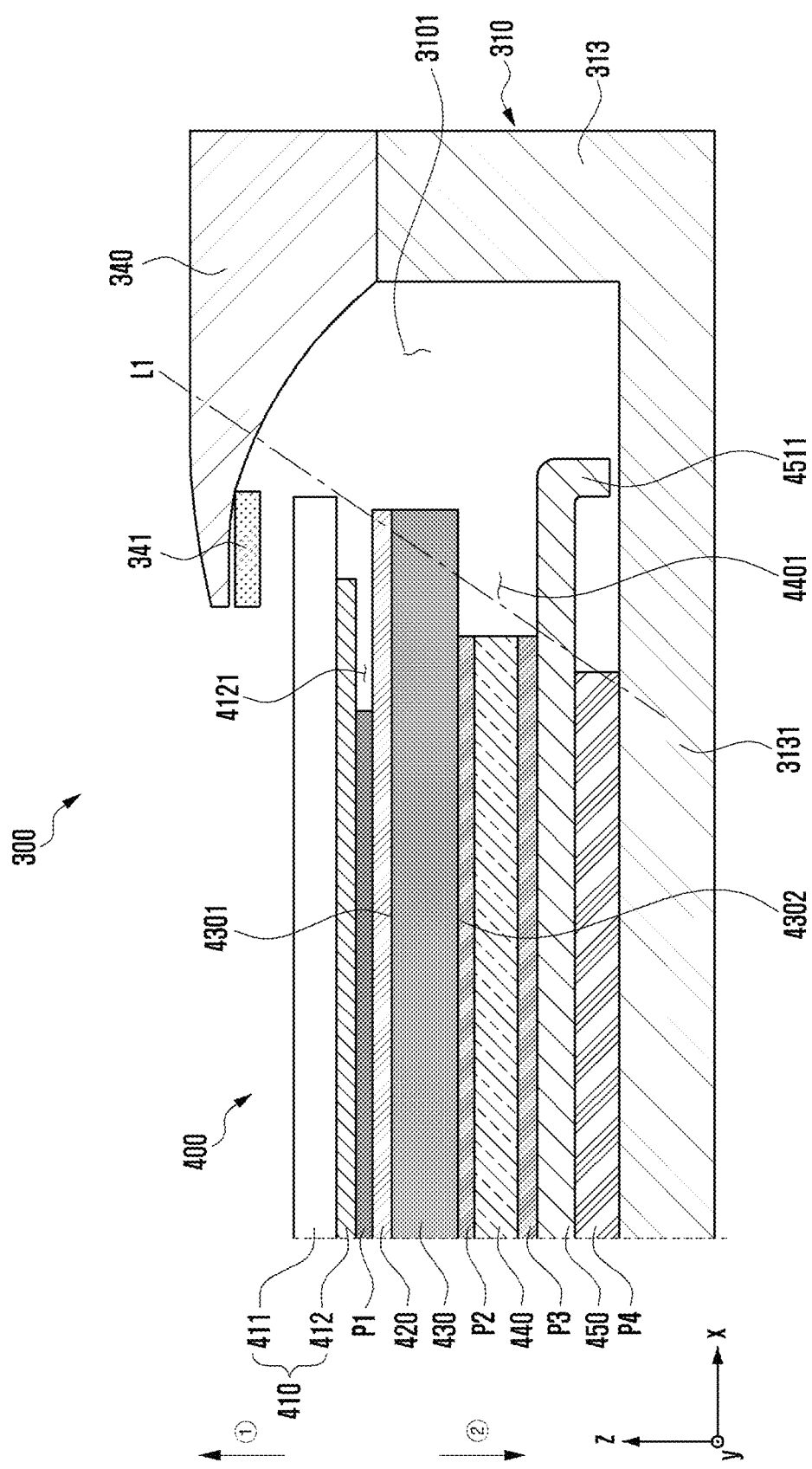
FIGS. 10A and 10B illustrate partial cross-sectional views of an electronic device illustrating a configuration of a metal sheet layer according to various embodiments of the disclosure.
Figure 10B:
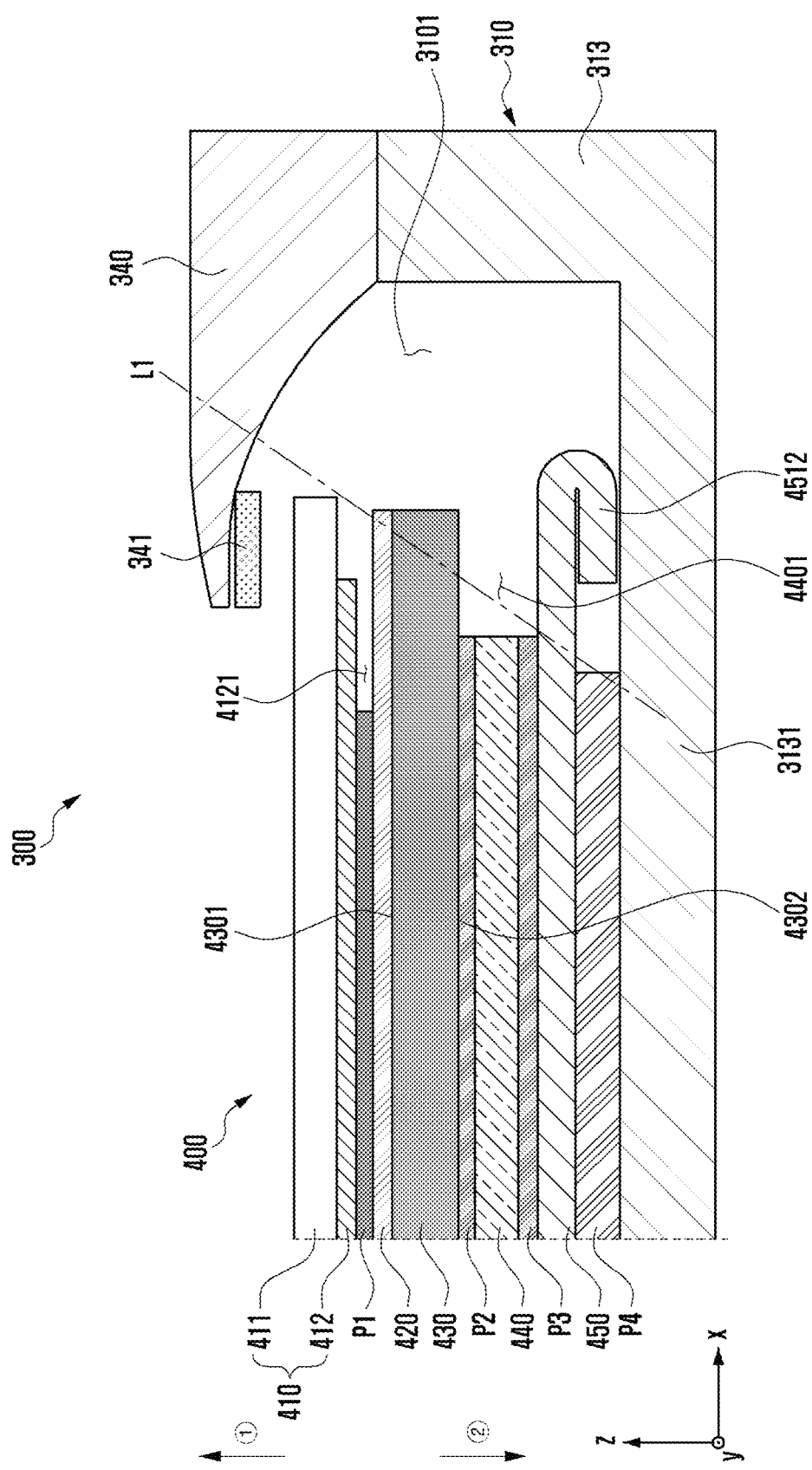

FIGS. 10A and 10B illustrate partial cross-sectional views of an electronic device 300 illustrating a configuration of a metal sheet layer 450 according to various embodiments of the disclosure.

In describing FIGS. 10A and 10B, substantially the same components as those of the electronic device 300 of FIGS. 7A and 7B are denoted by the same reference numerals, and a disposition structure of the flexible display 400 is substantially the same; thus, a detailed description thereof may be omitted.

Referring to FIG. 10A, an end portion of the metal sheet layer 450 may include a bending portion 4511 bent in a predetermined direction for rigid reinforcement. According to an embodiment, a folding direction of the bending portion 4511 may be determined according to a folding method of the electronic device 300. For example, as illustrated, when the electronic device 300 is folded in an in-folding manner, layers (e.g., the window layer 410, the polarizing layer 420, the display panel 430, the polymer member 440, or the metal sheet layer 450) of the flexible display 400 may generate interlayer slip that gradually increases in length toward the window layer 410 along a first inclined line L1. Therefore, the bending portion 4511 may be bent in a second direction (direction ②) so as not to disturb interlayer slip of layers (e.g., the window layer 410, the polarizing layer 420, the display panel 430, or the polymer member 440) disposed on the metal sheet layer 450.

Referring to FIG. 10B, a bending portion 4512 may be bent in a second direction (direction ②) through a hemming process, and then be formed to again face the rear surface of the metal sheet layer 450.

Figure 11:
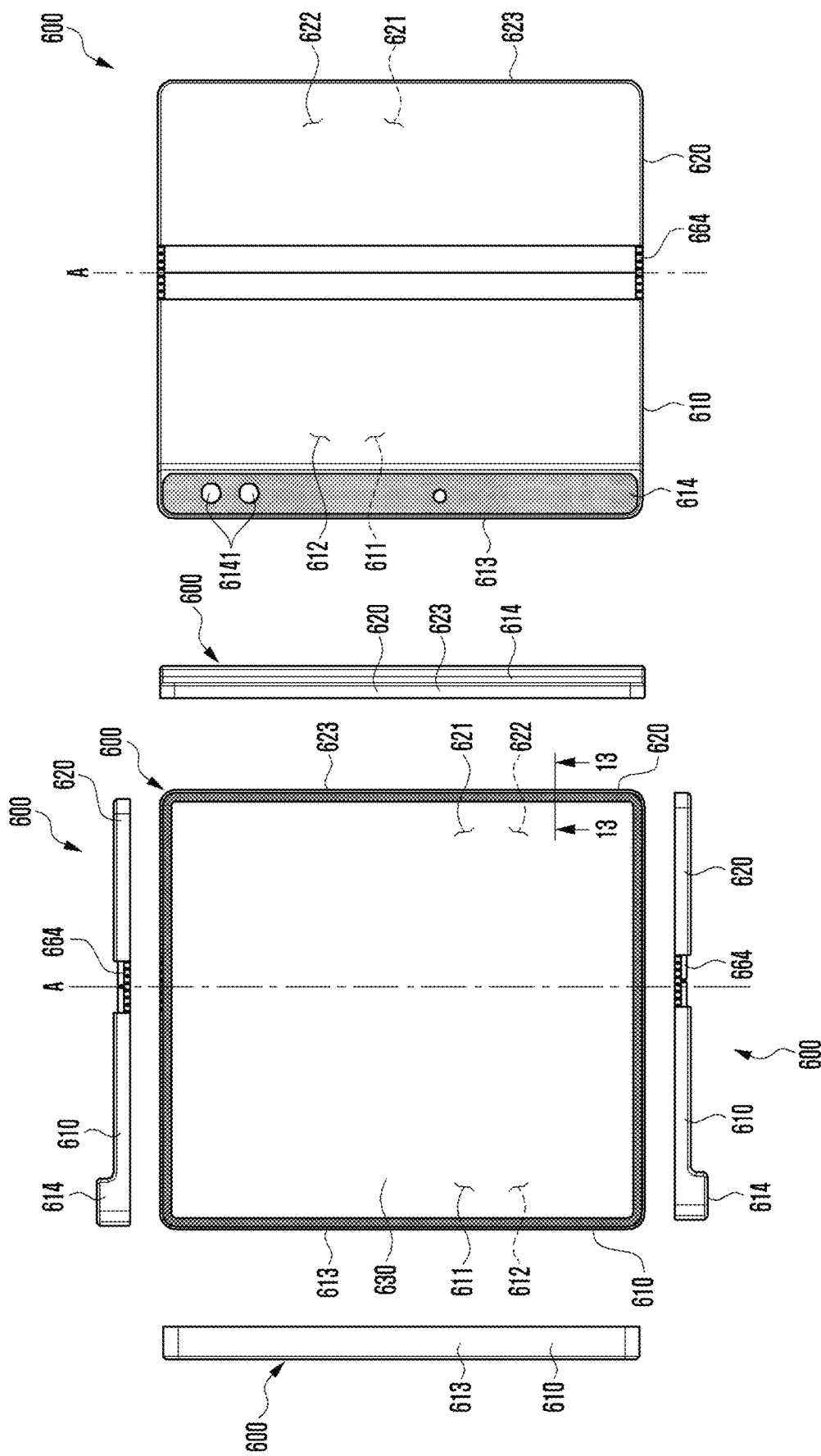
FIG. 11 illustrates a diagram of an unfolded state of an electronic device according to various embodiments of the disclosure.
Figure 12:
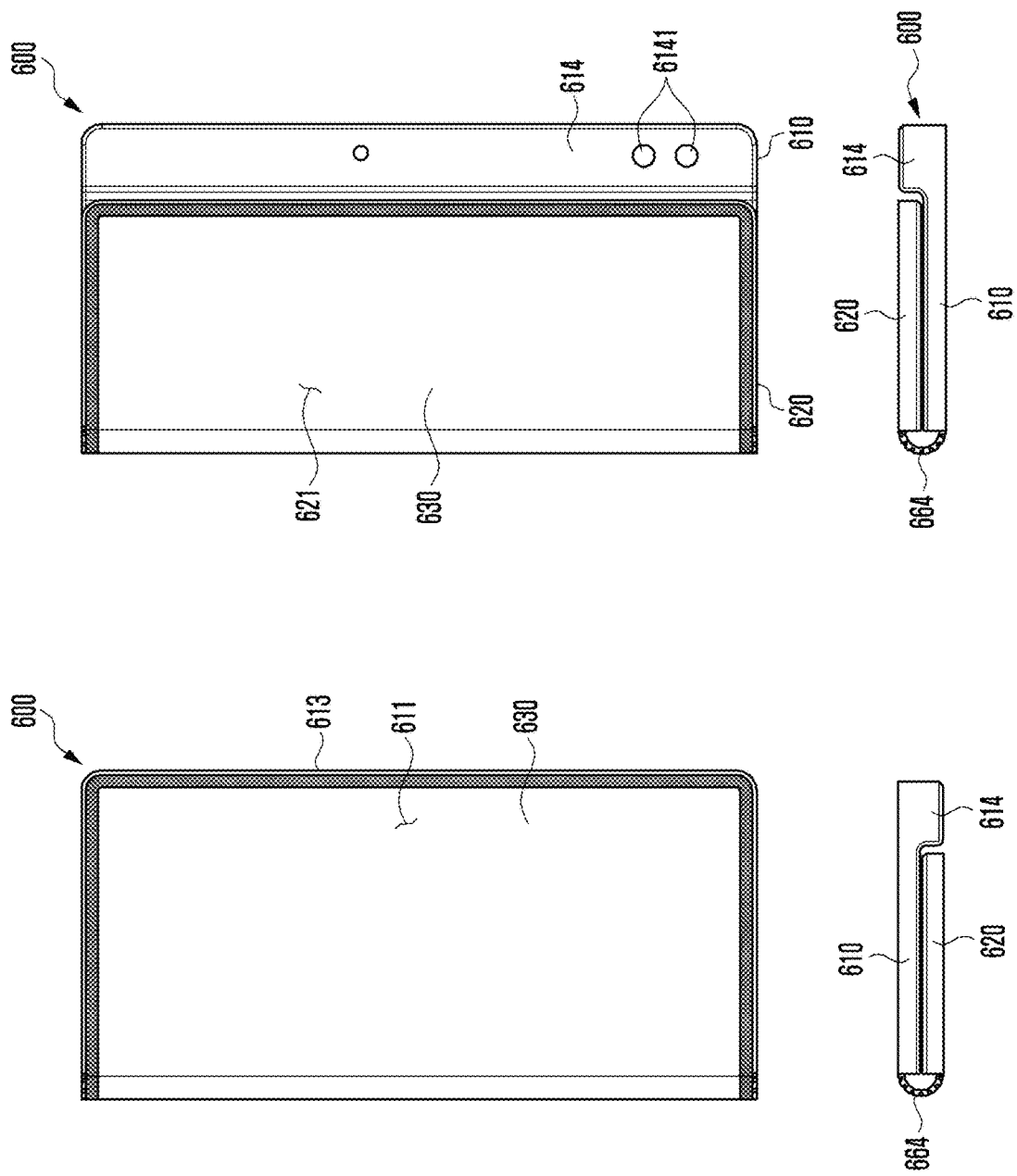
FIG. 12 illustrates a diagram of a folded state of the electronic device of FIG. 11 according to various embodiments of the disclosure.

FIG. 11 illustrates a diagram of an unfolded state of an electronic device 600 according to various embodiments of the disclosure. FIG. 12 illustrates a diagram of a folded state of the electronic device 600 of FIG. 11 according to various embodiments of the disclosure.

Referring to FIGS. 11 and 12, the electronic device 600 may include a first housing 610 including a first surface 611, a second surface 612 facing in a direction opposite to that of the first surface 611, and a first side member 613 enclosing a first space between the first surface 611 and the second surface 612. According to an embodiment, in a unfolded state, the electronic device 600 may include a second housing 620 including a third surface 621 facing in the same direction as that of the first surface 611, a fourth surface 622 facing in the same direction as that of the second surface 612, and a second side member 623 enclosing a second space between the third surface 621 and the fourth surface 622.

According to various embodiments, the first housing 610 and the second housing 620 may be rotatably installed with respect to each other through the hinge module 664. For example, the electronic device 600 may maintain a folded or unfolded state by rotating the first housing 610 and the second housing 620 with respect to each other through the hinge module 664. According to an embodiment, in a folded state of the electronic device 600, the second surface 612 and the fourth surface 622 may face, and in a unfolded state of the electronic device 600, the first surface 611 and the third surface 621 may face in the same direction. According to an embodiment, the electronic device 600 may include a flexible display 630 (e.g., the flexible display 400 of FIG. 4A) disposed to at least partially cross the first surface 611 and the third surface 621. According to an embodiment, the flexible display 630 may be disposed to receive support of at least a partial area of the first housing 610, the hinge module 664, and the second housing 620.

According to various embodiments, in a folded state of the electronic device 600, the second surface 612 and the fourth surface 622 face each other, and the first surface 611 and the third surface 621 are disposed to face the outside; thus, the flexible display 630 may be exposed to the outside. According to an embodiment, the electronic device 600 may include a protruding portion 614 disposed in at least a portion of the second surface 612 and formed higher than the second surface 612. According to an embodiment, the first housing 610 may be formed larger than the second housing 620. According to an embodiment, in the folded state of the electronic device 600, the fourth surface 622 of the second housing 620 partially faces the second surface 612 of the first housing 610, and the protruding portion 614 may be disposed at the remaining portion of the second surface 612 that does not face. In this case, in the electronic device 600, the third surface 621 of the second housing 620 may be folded in a fitted together manner to correspond to an outer surface of the protruding portion 614. According to an embodiment, the electronic device 600 may include at least one camera device 6141 disposed in the protruding portion 614. Although not illustrated, the electronic device 600 may include substantially the same all components of the electronic devices 100 and 300 illustrated in FIGS. 1 to 3 and/or FIGS. 4A to 9B.

Figure 13:
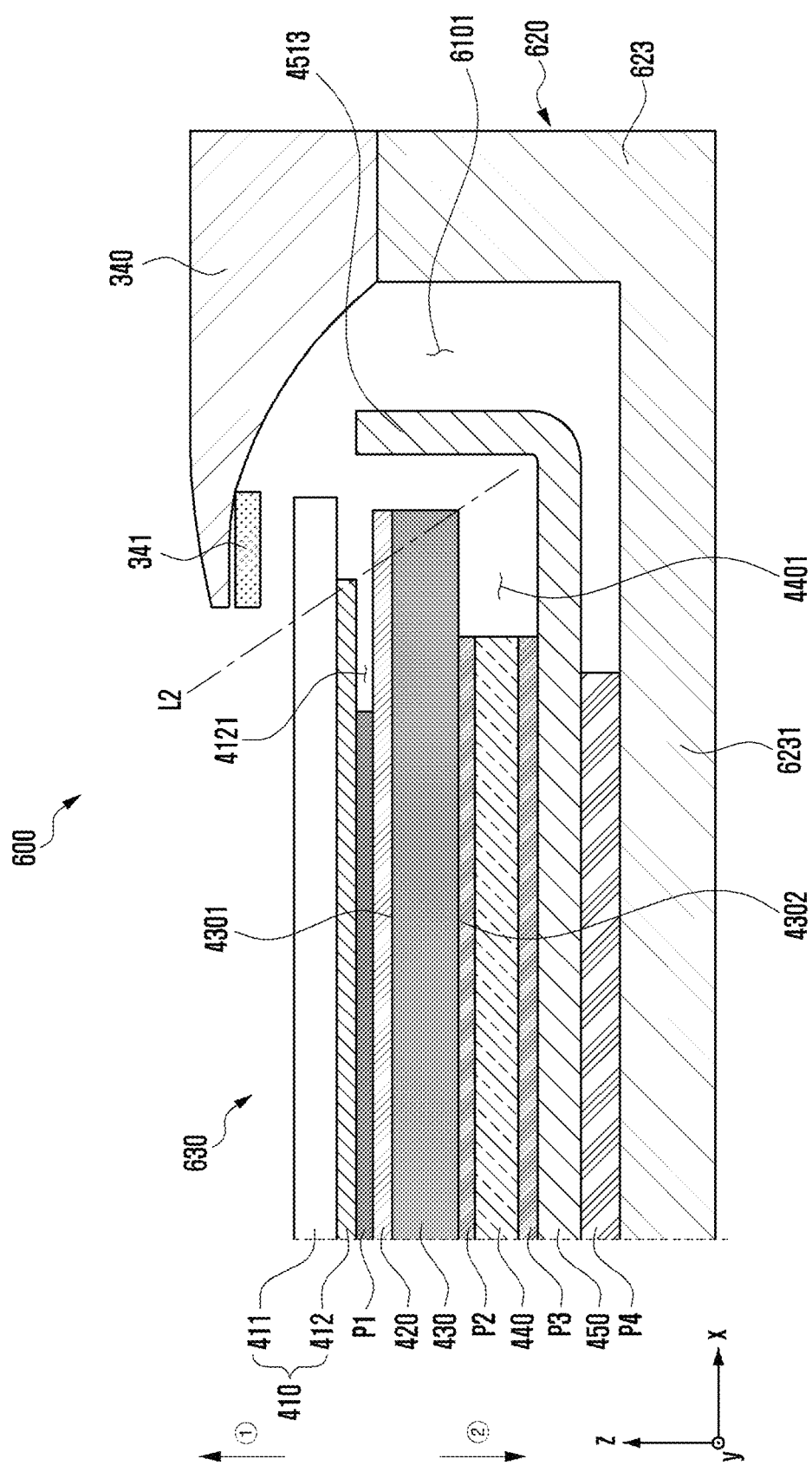
FIG. 13 illustrates a partial cross-sectional view of an electronic device viewed from line 13-13 of FIG. 11 according to various embodiments of the disclosure.

FIG. 13 illustrates a partial cross-sectional view of an electronic device 600 viewed from line 13-13 of FIG. 11 according to various embodiments of the disclosure.

In describing FIG. 13, substantially the same components as those of the electronic device 300 of FIGS. 7A and 7B are denoted by the same reference numerals, and a disposition structure of the flexible display 630 is substantially the same; thus, a detailed description thereof may be omitted.

Referring to FIG. 13, the electronic device 600 may include a second housing 620 including a second side member 623, a protection frame 340 disposed in at least a portion of the second side member 623, and a flexible display 630 disposed between the protection frame 340 and the second side member 623. According to one embodiment, the flexible display 630 may be disposed to receive support through a support member 6231 structurally coupled or extended at least partially from the second side member 623 to an inner space of the second housing 620. According to an embodiment, at least a portion of the edge of the flexible display 630 may be disposed in a space 6101 between the second side member 623 and the protective frame 340. Accordingly, the edge of the flexible display 630 may be disposed to be invisible from the outside of the electronic device 600. According to one embodiment, the electronic device 600 may further include a sealing member 341 disposed between the polymer layer 411 of the window layer 410 and the protective frame 340 to prevent an external foreign material from entering.

According to various embodiments, an end portion of the metal sheet layer 450 may include a bending portion 4513 bent in a predetermined direction for rigid reinforcement. According to an embodiment, a folding direction of the bending portion 4513 may be determined according to a folding method of the electronic device 600. For example, as illustrated, when the electronic device 600 is folded in an out-folding manner, layers (e.g., the window layer 410, the polarization layer 420, the display panel 430, the polymer member 440, or the metal sheet layer 450) of the flexible display 630 may generate interlayer slip that gradually decreases in length as they goes toward the window layer 410 along a second inclined line L2. Therefore, because the bending portion 4513 does not disturb interlayer slip of layers (e.g., the window layer 410, the polarizing layer 420, the display panel 430, or the polymer member 440) disposed on the metal sheet layer 450, the bending portion 4513 may be bent in a first direction (direction ①). In another embodiment, the bending portion 4513 may be bent in a second direction (direction ②). In another embodiment, the bending portion 4513 may be bent in the first direction (direction ①) or the second direction (direction ②) through a hemming process and then be formed in a manner facing a surface of the metal sheet layer 450.

According to various embodiments, a configuration has been illustrated and described in which an edge of the flexible displays 400 and 630 is interrupted by a space provided between the housings 310 and 320 and the protective frames 340 and 350. However, the disclosure is not limited thereto, and the flexible displays 400 and 630 according to embodiments of the disclosure may be disposed so that the edges are interrupted by a space provided through a structure of the housings 310 and 320 without protective frames 340 and 350.

According to various embodiments of the disclosure, by disposing at least one layer (e.g., metal sheet layer) of protective layers constituting a flexible display to be closer to inner side walls of housings than a display panel, when an external impact is applied, it is possible to prevent damage of the display panel through a buffering action due to a pre-impact of the protective layer, and a separate buffer space is excluded to help to slim the electronic device.

According to various embodiments, an electronic device (e.g., the electronic device 300 of FIG. 4A) includes a hinge module (e.g., the hinge module 364 of FIG. 4A); a first housing (e.g., the first housing 310 of FIG. 4A) connected to the hinge module; a second housing (e.g., the second housing 320 of FIG. 4A) connected to the hinge module so as to fold the first housing; a flexible display (e.g., the flexible display 400 of FIG. 4A) disposed through at least a portion of the first housing and the second housing, wherein the flexible display includes a display panel (e.g., the display panel 430 of FIG. 7A) including a first surface (e.g., the first surface 4301 of FIG. 7A) facing in a first direction (e.g., the direction ① of FIG. 7A) and a second surface (e.g., the second surface 4302 of FIG. 7A) facing in a direction opposite to that of the first surface, when the electronic device is in an unfolded state; a window layer (e.g., the window layer 410 of FIG. 7A) disposed at the first surface; and a metal sheet layer (e.g., the metal sheet layer 450 of FIG. 7A) disposed at the second surface of the display panel, wherein the display panel, the window layer, and the metal sheet layer are disposed so that a separation distance (e.g., the first separation distance d2 of FIG. 7A) between the display panel, the window layer, and the metal sheet layer and inner side walls (e.g., the first inner side wall 3102 of FIG. 7A and the second inner side wall 3202 of FIG. 8A) of the first housing and the second housing generate different interlayer slips in the unfolded state and a folded state of the electronic device, and wherein the metal sheet layer is disposed to at least partially overlap the display panel and is disposed closer to the inner side walls of the first housing and the second housing than the display panel, when viewed from above the flexible display.

According to various embodiments, the window layer may include a polymer layer (e.g., the polymer layer 411 of FIG. 7A) and a glass layer (e.g., the glass layer 412 of FIG. 7A) disposed between the polymer layer and the display panel, and the polymer layer may be disposed to at least partially overlap the glass layer and be disposed closer to the inner side wall than the glass layer, when viewed from above the display.

According to various embodiments, the glass layer and the display panel may be at least partially attached through an adhesive (e.g., the glass layer P1 of FIG. 7A).

According to various embodiments, the adhesive may be disposed at a position overlapped with at least an active area of the display panel, when viewed from above the flexible display.

According to various embodiments, the electronic device may further include a polarizing layer (e.g., the polarizing layer 420 of FIG. 7A) disposed between the display panel and the glass layer.

According to various embodiments, the electronic device may further include a touch panel disposed between the glass layer and the polarizing layer, between the polarizing layer and the display panel, or in the display panel.

According to various embodiments, the electronic device may further include at least one sub-material layer (e.g., the polymer member 440 of FIG. 5) disposed between the metal sheet layer and the display panel.

According to various embodiments, the electronic device may further include a first protective frame (e.g., the first protective frame 340 of FIG. 7A) coupled to the first housing with a first edge of the metal sheet layer facing the first housing interposed therebetween; and a second protective frame (e.g., the second protective frame 350 of FIG. 8A) coupled to the second housing with a second edge of the metal sheet layer facing the second housing interposed therebetween According to various embodiments, the flexible display may be movably disposed in a space (e.g., the first space 3101 of FIG. 7A or the second space 3201 of FIG. 8A) between the first housing and the first protection frame and between the second housing and the second protection frame.

According to various embodiments, when the electronic device is in the folded state and the unfolded state, the space may be formed in a size to receive an edge of the flexible display.

According to various embodiments, when viewed from above the flexible display, the metal sheet layer may be formed in a size in which all edges of the metal sheet layer are visible outside the edge of the display panel.

According to various embodiments, the flexible display may be disposed so that an end portion of the metal sheet layer is selectively close to the inner side wall according to a folding operation of the electronic device.

According to various embodiments, the flexible display may include a flexible printed circuit board (FPCB) (e.g., the FPCB 432 of FIG. 8A) extended from the display panel and contacting at least a portion of the metal sheet layer through bending, and the metal sheet layer may include a receiving portion (e.g., the second edge 4502 of FIG. 8A) formed to be recessed further than an edge (e.g., the receiving portion 4502a of FIG. 8A) so as to receive a bent portion of the FPCB.

According to various embodiments, the receiving portion may be formed in a depth that enables the bent portion of the FPCB not to protrude further than the edge of the metal sheet layer.

According to various embodiments, when viewed from above the flexible display, a protrusion amount (e.g., the first protrusion amount d1 of FIG. 7A) of the metal sheet layer protruded further than the display panel toward the inner side wall may be determined through a separation distance (e.g., the first separation distance d2 of FIG. 7A) between the metal sheet layer and the inner side wall.

According to various embodiments, the end portion of the metal sheet layer may further include a bent portion (e.g., the bent portion 4511 of FIG. 10A) bent in the first direction or the second direction.

According to various embodiments, a bending direction of the bent portion may be determined according to an interlayer slip direction of the window layer, the display panel, or the metal sheet layer in the unfolded state and the folded state of the electronic device.

According to various embodiments, an electronic device (e.g., the electronic device 300 of FIG. 4A) includes a hinge module (e.g., the hinge module 364 of FIG. 4A); a first housing (e.g., the first housing 310 of FIG. 4A) connected to the hinge module; a second housing (e.g., the second housing 320 of FIG. 4A) connected to the hinge module so as to fold the first housing; a flexible display (e.g., the flexible display 400 of FIG. 4A) disposed through at least a portion of the first housing and the second housing, wherein the flexible display includes a display panel (e.g., the display panel 430 of FIG. 7A) including a first surface (e.g., the first surface 4301 of FIG. 7A) facing in a first direction (e.g., the direction ① of FIG. 7A) and a second surface (e.g., the second surface 4302 of FIG. 7A) facing in a direction opposite to that of the first surface, when the electronic device is in an unfolded state; a window layer (e.g., the window layer 410 of FIG. 7A) disposed at the first surface; and a metal sheet layer (e.g., the metal sheet layer 450 of FIG. 7A) disposed at the second surface of the display panel, wherein the flexible display is movably disposed on the first housing and the second housing in a direction (e.g., x-axis direction of FIG. 4A) perpendicular to the first rotation axis (e.g., the first rotation axis A of FIG. 4B), when the electronic device is in a folded state and an unfolded state, and wherein the metal sheet layer is disposed to at least partially overlap the display panel and is disposed closer to inner side walls (e.g., the first inner side wall 3102 of FIG. 7A and the second inner side wall 3202 of FIG. 8A) of the first housing and the second housing than the display panel, when viewed from above the flexible display.

According to various embodiments, the window layer may include a polymer layer and a glass layer disposed between the polymer layer and the display panel, and the polymer layer may be disposed to at least partially overlap the glass layer and be disposed closer to the inner side wall than the glass layer, when viewed from above the display.

According to various embodiments, the glass layer and the display panel may be attached at least partially through an adhesive, and the adhesive may be disposed at a position overlapped with at least an active area of the display panel, when viewed from above the flexible display.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device, comprising:
a hinge module;
a first housing connected to the hinge module;
a second housing connected to the hinge module so as to fold with respect to the first housing; and
a flexible display disposed through at least a portion of the first housing and the second housing, wherein the flexible display comprises:
a display panel comprising a first surface facing in a first direction and a second surface facing in a second direction opposite to that of the first surface, when the electronic device is in an unfolded state,
a window layer disposed at the first surface, and
a metal sheet layer disposed at the second surface of the display panel,
wherein the display panel, the window layer, and the metal sheet layer are disposed so that a separation distance between the display panel, the window layer, and the metal sheet layer and inner side walls of the first housing and the second housing generate different interlayer slips in the unfolded state and a folded state of the electronic device, and
wherein the metal sheet layer is disposed to at least partially overlap the display panel and edges of the metal sheet layer protrude outward relative to edges of the display panel such that the edges of the metal sheet layer are disposed closer to the inner side walls of the first housing and the second housing than the edges of the display panel, when viewed from above the flexible display, such that the metal sheet layer provides a buffer against collision of the display panel with the inner side walls.

2. The electronic device of claim 1, wherein the window layer comprises a polymer layer and a glass layer disposed between the polymer layer and the display panel, and
wherein the polymer layer is disposed to at least partially overlap the glass layer and is disposed closer to the inner side walls than the glass layer, when viewed from above the display panel.

3. The electronic device of claim 2, wherein the glass layer and the display panel are at least partially attached through an adhesive.

4. The electronic device of claim 3, wherein the adhesive is disposed at a position overlapped with at least an active area of the display panel, when viewed from above the flexible display.

5. The electronic device of claim 1, further comprising a polarizing layer disposed between the display panel and a glass layer.

6. The electronic device of claim 5, further comprising a touch panel disposed between the glass layer and the polarizing layer, between the polarizing layer and the display panel, or in the display panel.

7. The electronic device of claim 1, further comprising at least one sub-material layer disposed between the metal sheet layer and the display panel.

8. The electronic device of claim 1, further comprising:
a first protective frame coupled to the first housing with a first edge of the metal sheet layer facing the first housing interposed therebetween; and
a second protective frame coupled to the second housing with a second edge of the metal sheet layer facing the second housing interposed therebetween.

9. The electronic device of claim 8, wherein the flexible display is movably disposed in a space between the first housing and the first protection frame and between the second housing and the second protection frame.

10. The electronic device of claim 9, wherein the space is formed in a size to receive an edge of the flexible display, when the electronic device is in the folded state and the unfolded state.

11. The electronic device of claim 1, wherein the metal sheet layer is formed in a size that all edges of the metal sheet layer are visible outside the edges of the display panel, when viewed from above the flexible display.

12. The electronic device of claim 1, wherein the flexible display is disposed such that an end portion of the metal sheet layer is selectively close to the inner side walls according to a folding operation of the electronic device.

13. The electronic device of claim 1, wherein:
the flexible display comprises a flexible printed circuit board (FPCB) extending from the display panel and contacting at least a portion of the metal sheet layer through bending, and
the metal sheet layer comprises a receiving portion formed to be recessed into one edge of the metal sheet layer so as to receive a bent portion of the FPCB.

14. The electronic device of claim 13, wherein the receiving portion is formed with a depth that enables the bent portion of the FPCB not to protrude further than the one edge of the metal sheet layer.

15. The electronic device of claim 1, wherein an amount that each of the edges of the metal sheet layer protrudes outward from the edges of the display panel toward each of the inner side walls is determined through a separation distance between the metal sheet layer and each inner side wall, when viewed from above the flexible display.

16. The electronic device of claim 1, wherein an end portion of the metal sheet layer further comprises a bent portion that is bent in the first direction or the second direction.

17. The electronic device of claim 16, wherein a bending direction of the bent portion is determined according to an interlayer slip direction of the window layer, the display panel, or the metal sheet layer in the unfolded state and the folded state of the electronic device.

18. An electronic device, comprising:
a hinge module;
a first housing connected to the hinge module;
a second housing connected to the hinge module so as to fold with respect to the first housing based on a first rotation axis; and
a flexible display disposed through at least a portion of the first housing and the second housing, wherein the flexible display comprises:
a display panel comprising a first surface facing in a first direction and a second surface facing in a second direction opposite to that of the first surface, when the electronic device is in an unfolded state,
a window layer disposed at the first surface of the display panel, and
a metal sheet layer disposed at the second surface of the display panel,
wherein the flexible display is movably disposed on the first housing and the second housing in a direction perpendicular to the first rotation axis, when the electronic device is in a folded state and an unfolded state, and
wherein the metal sheet layer is disposed to at least partially overlap the display panel and edges of the metal sheet layer protrude outward relative to edges of the display panel such that the edges of the metal sheet layer are disposed closer to inner side walls of the first housing and the second housing than the edges of the display panel, when viewed from above the flexible display, such that the metal sheet layer provides a buffer against collision of the display panel with the inner side walls.

19. The electronic device of claim 18, wherein:
the window layer comprises a polymer layer and a glass layer disposed between the polymer layer and the display panel, and
the polymer layer is disposed to at least partially overlap the glass layer and is disposed closer to the inner side walls than the glass layer, when viewed from above the display panel.

20. The electronic device of claim 19, wherein:
the glass layer and the display panel are attached at least partially through an adhesive, and
the adhesive is disposed at a position overlapped with at least an active area of the display panel, when viewed from above the flexible display.

* * * * *